United States Patent
Woo

(10) Patent No.: US 11,557,627 B2
(45) Date of Patent: Jan. 17, 2023

(54) LIGHT EMITTING DIODE DISPLAY DEVICE AND METHOD OF MANUFACTURING THE SAME

(71) Applicant: Samsung Display Co., Ltd., Yongin-si (KR)

(72) Inventor: Yeoung Keol Woo, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 16/388,511

(22) Filed: Apr. 18, 2019

(65) Prior Publication Data

US 2020/0020741 A1 Jan. 16, 2020

(30) Foreign Application Priority Data

Jul. 13, 2018 (KR) .......................... 10-2018-0081378

(51) Int. Cl.

| | |
|---|---|
| *H01L 27/15* | (2006.01) |
| *H01L 33/06* | (2010.01) |
| *H01L 33/24* | (2010.01) |
| *H01L 33/32* | (2010.01) |
| *H01L 33/62* | (2010.01) |
| *H01L 33/60* | (2010.01) |
| *H01L 33/38* | (2010.01) |

(52) U.S. Cl.
CPC ............ *H01L 27/156* (2013.01); *H01L 33/06* (2013.01); *H01L 33/24* (2013.01); *H01L 33/32* (2013.01); *H01L 33/38* (2013.01); *H01L 33/60* (2013.01); *H01L 33/62* (2013.01); *H01L 2933/0016* (2013.01); *H01L 2933/0058* (2013.01); *H01L 2933/0066* (2013.01)

(58) Field of Classification Search
CPC ........ H01L 33/387; H01L 33/38; H05B 45/40
See application file for complete search history.

(56) References Cited

U.S. PATENT DOCUMENTS 8,872,214 B2 * 10/2014 Negishi ................... H01L 33/20
257/99
9,112,112 B2  8/2015 Do et al.
(Continued)

FOREIGN PATENT DOCUMENTS

| KR | 10-2011-0040174 A | 4/2011 |
|---|---|---|
| KR | 10-1490758 B1 | 2/2015 |

*Primary Examiner* — Grant S Withers
(74) *Attorney, Agent, or Firm* — Lewis Roca Rothgerber Christie LLP

(57) ABSTRACT

A light emitting device includes: a base layer; a first conductive layer on the base layer, and including first and second electrode patterns, and exposing a portion of the base layer at a first area between the first and second electrode patterns; a fine light emitting diode (LED) at the first area; a second conductive layer covering the second electrode pattern and a first side of the fine LED, and contacting the second electrode pattern and the first side of the fine LED; a first insulation layer on the second conductive layer and the fine LED, and partially exposing a second side of the fine LED; and a third conductive layer covering the first electrode pattern and the second side of the fine LED and a portion of a sidewall of the insulation layer, and contacting the first electrode pattern and the second side of the fine LED.

25 Claims, 24 Drawing Sheets

(56) References Cited

U.S. PATENT DOCUMENTS

| | | | |
|---|---|---|---|
| 2011/0089850 A1* | 4/2011 | Shibata | H05B 45/40 |
| | | | 315/250 |
| 2016/0148911 A1* | 5/2016 | Do | H01L 33/62 |
| | | | 257/88 |
| 2018/0012876 A1* | 1/2018 | Kim | H01L 33/387 |
| 2018/0019369 A1* | 1/2018 | Cho | H01L 25/0753 |
| 2018/0019377 A1* | 1/2018 | Kim | H01L 33/24 |
| 2018/0175009 A1* | 6/2018 | Kim | H01L 25/0753 |
| 2019/0044024 A1* | 2/2019 | Woo | H01L 27/156 |
| 2019/0096858 A1* | 3/2019 | Woo | H01L 33/62 |
| 2019/0115513 A1* | 4/2019 | Im | H05K 1/0296 |
| 2019/0244567 A1* | 8/2019 | Cho | H01L 33/44 |
| 2019/0244985 A1* | 8/2019 | Kim | H01L 27/124 |
| 2019/0251898 A1* | 8/2019 | Cho | G06F 3/0421 |
| 2019/0305035 A1* | 10/2019 | Cho | H01L 33/46 |
| 2019/0319168 A1* | 10/2019 | Kim | H01L 25/0753 |
| 2020/0075814 A1* | 3/2020 | Park | H01L 25/0753 |
| 2020/0144453 A1* | 5/2020 | Chang | H01L 33/38 |
| 2020/0273906 A1* | 8/2020 | Li | H01L 33/38 |
| 2021/0167124 A1* | 6/2021 | Min | H01L 33/12 |
| 2021/0167253 A1* | 6/2021 | Basrur | H01L 33/20 |
| 2021/0296538 A1* | 9/2021 | Li | H01L 33/62 |
| 2021/0391380 A1* | 12/2021 | Li | H01L 33/62 |
| 2022/0005978 A1* | 1/2022 | Im | H01L 27/156 |
| 2022/0005979 A1* | 1/2022 | Kang | H01L 25/0753 |
| 2022/0069003 A1* | 3/2022 | Lee | H01L 33/62 |
| 2022/0069004 A1* | 3/2022 | Kang | H01L 33/44 |
| 2022/0077228 A1* | 3/2022 | Do | H01L 25/0753 |

\* cited by examiner

LIGHT EMITTING DIODE DISPLAY DEVICE AND METHOD OF MANUFACTURING THE SAME

CROSS-REFERENCE TO RELATED APPLICATION

This application claims priority to and the benefit of Korean Patent Application No. 10-2018-0081378, filed on Jul. 13, 2018, in the Korean Intellectual Property Office, the disclosure of which is incorporated herein by reference in its entirety.

BACKGROUND

1. Field

The present disclosure relates to a device including light emitting diodes and a method of manufacturing the same.

2. Description of the Related Art

A light emitting diode (LED) is an element configured to convert electric signals to light such as infrared light, visible light, or the like, using a characteristic of a compound semiconductor, and is used for household appliances, remote controllers, electronic display boards, various automated devices, and the like. Applications of the LED have gradually expanded.

Further, attempts for applying the LED to a display device have expanded. As an example, attempts for using LEDs as a backlight of a display device, or minimizing or reducing the LED (e.g., reducing a size of the LED) in a display unit capable of displaying an image to directly implement a self-emission type display have expanded.

Accordingly, in order to secure sufficient brightness usable for various devices even when LEDs are minimized or reduced, a structure in which a plurality of LEDs can be integrated is desired.

SUMMARY

However, when LEDs are minimized or reduced (e.g., when a size of each of the LEDs are reduced) to be integrated with a display device, a connection structure of light emitting units and electrodes or wires which provide a voltage to the light emitting units should have high reliability.

Aspects of embodiments of the present disclosure provide a light emitting device in which reliability of a connection structure between a light emitting unit and an electrode connected to the light emitting unit is secured.

Aspects of embodiments of the present disclosure also provide a method of manufacturing the light emitting device in which reliability of the connection structure between the light emitting unit and the electrode connected to the light emitting unit may be secured.

However, aspects of embodiments of the present invention are not restricted to those set forth herein. The above and other aspects of embodiments of the present invention will become more apparent to one of ordinary skill in the art to which the present invention pertains by referencing the detailed description of the present invention given below.

According to an exemplary embodiment of the present disclosure, a light emitting device includes: a base layer; a first conductive layer on the base layer, the first conductive layer including a first electrode pattern and a second electrode pattern, and exposing the base layer at a first area between the first electrode pattern and the second electrode pattern; a fine light emitting diode at the first area on the base layer; a second conductive layer covering the second electrode pattern and a first side of the fine light emitting diode, the second conductive layer being in contact with the second electrode pattern and the first side of the fine light emitting diode; a first insulation layer on the second conductive layer and the fine light emitting diode, the first insulation layer partially exposing a second side of the fine light emitting diode opposite to the first side of the fine light emitting diode; and a third conductive layer covering the first electrode pattern and the second side of the fine light emitting diode, the third conductive layer being in contact with the first electrode pattern and the second side of the fine light emitting diode, and covering at least a portion of a sidewall of the insulation layer.

In an exemplary embodiment, the light emitting device may further include: a second insulation layer on the second conductive layer, and overlapping the base layer; a driving circuit layer on the second insulation layer, and including a thin film transistor; and a data conductor electrically connecting the thin film transistor and the second electrode pattern through an opening in the second insulation layer, the opening exposing the second electrode pattern.

In an exemplary embodiment, the light emitting device may further include: a third insulation layer on the driving circuit layer, the second conductive layer may cover the fine light emitting diode, the opening may pass through the second conductive layer to expose the second electrode pattern, and the data conductor may be insulated from the second conductive layer through the third insulation layer at an inner side surface of the opening.

In an exemplary embodiment, the light emitting device may further include: a buffer layer between the base layer and the first conductive layer; and a reflection layer between the base layer and the buffer layer, and overlapping the fine light emitting diode.

In an exemplary embodiment, the reflection layer may overlap the first and second electrode patterns.

In an exemplary embodiment, the reflection layer may overlap the second electrode pattern, and partially overlap the first electrode pattern.

In an exemplary embodiment, the light emitting device may further include: a driving circuit layer under the base layer, and including a thin film transistor; and a data conductor connecting the driving circuit layer and the second electrode pattern through an opening in the base layer and the buffer layer, the opening exposing the second electrode pattern.

In an exemplary embodiment, the light emitting device may further include a partition on the base layer and under the first electrode pattern, and the second electrode pattern may be in direct surface contact with the base layer.

In an exemplary embodiment, the fine light emitting diode may include a light emitting material and a protection layer around the light emitting material in a cylindrical shape.

In an exemplary embodiment, the fine light emitting diode may have a cylindrical shape, and may include a first sidewall corresponding to an upper surface thereof and a second sidewall corresponding to a lower surface thereof.

In an exemplary embodiment, the light emitting material may have a structure in which a p-type semiconductor layer, an intermediate layer, and an n-type semiconductor layer are sequentially arranged.

In an exemplary embodiment, the first sidewall may expose the p-type semiconductor layer, and the second sidewall may expose the n-type semiconductor layer.

In an exemplary embodiment, the first sidewall may be in contact with the first conductive layer, and the second sidewall may be in contact with the second conductive layer.

In an exemplary embodiment, the light emitting material may have an inorganic crystalline structure.

In an exemplary embodiment, the first insulation layer may cover the first conductive layer; and the second conductive layer may cover the first insulation layer and may include a reflective material.

In an exemplary embodiment, the light emitting device may further include: a partition on the base layer and under the first and second electrode patterns.

In an exemplary embodiment, the light emitting device may further include: a buffer layer between the base layer and the first conductive layer; and a reflection layer between the base layer and the buffer layer, the reflection layer overlapping the fine light emitting diode.

According to an exemplary embodiment of the present disclosure, a light emitting device includes: a base layer; a first electrode pattern on the base layer, and including first and second fine electrode lines that are parallel to each other; a second electrode pattern on the base layer, and including a third fine electrode line between the first and second fine electrode lines; a first fine light emitting diode between the first and third fine electrode lines; a second fine light emitting diode between the second and third fine electrode lines; a first conductive layer directly on the second fine electrode line, the first fine light emitting diode, and the second fine light emitting diode, the first conductive layer electrically connecting the second electrode pattern and the first and second fine light emitting diodes; a first insulation layer covering the first conductive layer, and exposing a first side of each of the first and second fine light emitting diodes; and a second conductive layer on the first conductive layer, and electrically connecting the first electrode pattern and the first and second fine light emitting diodes.

In an exemplary embodiment, the light emitting device may further include: a second insulation layer on the second conductive layer, and overlapping the base layer; a driving circuit layer on the second insulation layer, and including a thin film transistor; and a data conductor electrically connecting the thin film transistor and the second electrode pattern through an opening in the second insulation layer, the opening exposing the second electrode pattern.

In an exemplary embodiment, the second conductive layer may include a first conductive layer electrically connecting the first fine light emitting diode and the second electrode pattern, and a second conductive layer electrically connecting the second fine light emitting diode and the second electrode pattern, and the second conductive layer may not overlap the first electrode pattern.

In an exemplary embodiment, the light emitting device may further include a third insulation layer on the driving circuit layer, the second conductive layer may cover the first and second fine light emitting diodes; the opening may pass through the second conductive layer to expose the second electrode pattern; and the data conductor may be insulated from the second conductive layer through the third insulation layer in an inner side surface of the opening.

In an exemplary embodiment, the light emitting device may further include: a buffer layer between the base layer and the first and second electrode patterns; and a reflection layer between the base layer and the buffer layer, and overlapping the first and second fine light emitting diodes.

In an exemplary embodiment, the reflection layer may overlap the first and second electrode patterns.

In an exemplary embodiment, the reflection layer may overlap the third fine electrode line, and may partially overlap at least one of the first and second fine electrode lines.

In an exemplary embodiment, the light emitting device may further include: a driving circuit layer under the base layer, and including a thin film transistor; and a data conductor connecting the driving circuit layer and the second electrode pattern through an opening in the base layer and the buffer layer, the opening exposing the second electrode pattern.

In an exemplary embodiment, the light emitting device may further include a partition on the base layer and under the first electrode pattern.

According to an exemplary embodiment of the present disclosure, a method of manufacturing a light emitting device includes: forming a first conductive layer including a first electrode pattern and a second electrode pattern on a base layer; arranging a fine light emitting diode between the first and second electrode patterns; covering an entire surface of the second electrode pattern and a first side of the fine light emitting diode with a first conductive layer; covering the first conductive layer with a first insulation layer; and covering a second side of the fine light emitting diode exposed through the first insulation layer, the first electrode pattern, and a sidewall of the first insulation layer with a second conductive layer.

In an exemplary embodiment, the first conductive layer may fix the fine light emitting diode to the base layer; the first conductive layer may be formed directly after arranging the fine light emitting diode; and a mask process may be omitted between the arranging of the fine light emitting diode and the forming of the first conductive layer.

In an exemplary embodiment, the first and second electrode patterns may be directly formed on the base layer; and the base layer may have a flat upper surface.

In an exemplary embodiment, the base layer may include a reflection layer; and the fine light emitting diode may overlap the reflection layer.

BRIEF DESCRIPTION OF THE DRAWINGS

The above and other aspects and features of the present disclosure will become more apparent by describing exemplary embodiments thereof with reference to the attached drawings, in which.

DETAILED DESCRIPTION

Figure 1:
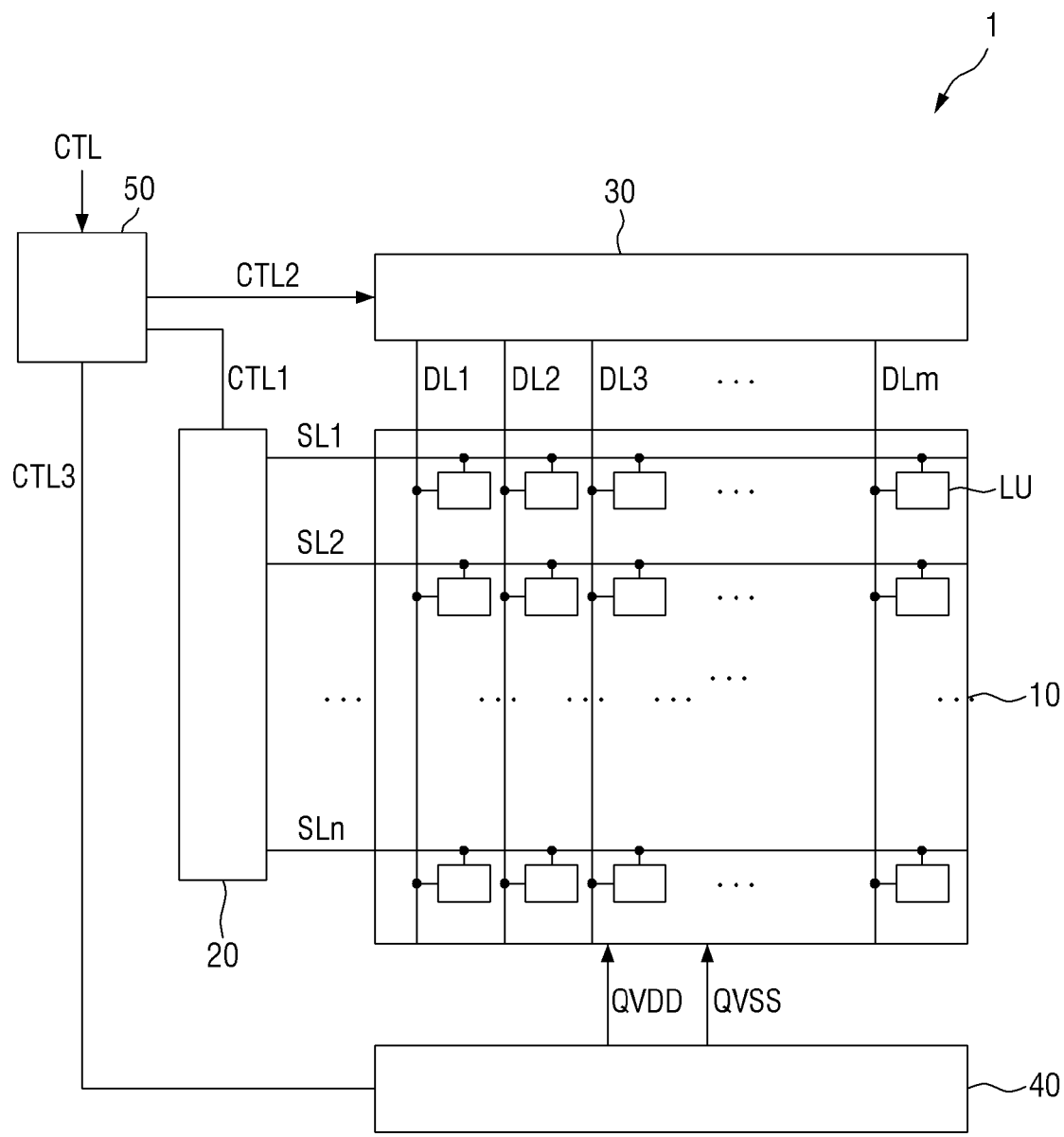
FIG. 1 is a block diagram illustrating a light emitting device according to an embodiment.

The present invention will now be described more fully hereinafter with reference to the accompanying drawings, in which exemplary embodiments of the invention are shown. This invention may, however, be embodied in different forms and should not be construed as limited to the embodiment set forth herein. Rather, these embodiments are provided so that this disclosure will be thorough and complete, and will fully convey the scope of the invention to those skilled in the art. Accordingly, processes, elements, and techniques that are not necessary to those having ordinary skill in the art for a complete understanding of the aspects and features of the present invention may not be described. Unless otherwise noted, like reference numerals denote like elements throughout the attached drawings and the written description, and thus, descriptions thereof may not be repeated. In the drawings, the relative sizes of elements, layers, and regions may be exaggerated for clarity.

It will also be understood that when a layer is referred to as being "on" or "connected to" another layer or substrate, it can be directly on or connected to the other layer or substrate, or intervening layers may also be present. In addition, it will also be understood that when an element or layer is referred to as being "between" two elements or layers, it can be the only element or layer between the two elements or layers, or one or more intervening elements or layers may also be present.

It will be understood that, although the terms "first," "second," etc. may be used herein to describe various elements, these elements should not be limited by these terms. These terms are only used to distinguish one element from another element. For instance, a first element discussed below could be termed a second element without departing from the teachings of the present invention. Similarly, the second element could also be termed the first element.

Spatially relative terms, such as "lower," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as being a "lower" element, other elements or features would then be oriented above or "upper" relative to the other elements or features. Thus, the example terms "lower" and "upper" can encompass both an orientation of lower and upper. The device may be otherwise oriented (e.g., rotated 90 degrees or at other orientations) and the spatially relative descriptors used herein should be interpreted accordingly.

The terminology used herein is for the purpose of describing particular embodiments and is not intended to be limiting of the present invention. As used herein, the singular forms "a" and "an" are intended to include the plural forms as well, unless the context clearly indicates otherwise. It will be further understood that the terms "comprises," "comprising," "includes," and "including," when used in this specification, specify the presence of the stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list.

As used herein, the terms "substantially," "about," and similar terms are used as terms of approximation and not as terms of degree, and are intended to account for the inherent variations in measured or calculated values that would be recognized by those of ordinary skill in the art. Further, the use of "may" when describing embodiments of the present invention refers to "one or more embodiments of the present invention." In addition, the use of alternative language, such as "or," when describing embodiments of the present invention, refers to "one or more embodiments of the present invention" for each corresponding item listed. As used herein, the terms "use," "using," and "used" may be considered synonymous with the terms "utilize," "utilizing," and "utilized," respectively. Also, the term "exemplary" is intended to refer to an example or illustration.

The electronic or electric devices (e.g., a scanning driver, a data driver, a timing controller) and/or any other relevant devices or components according to embodiments of the present invention described herein may be implemented utilizing any suitable hardware, firmware (e.g. an application-specific integrated circuit), software, or a combination of software, firmware, and hardware. For example, the various components of these devices may be formed on one integrated circuit (IC) chip or on separate IC chips. Further, the various components of these devices may be implemented on a flexible printed circuit film, a tape carrier package (TCP), a printed circuit board (PCB), or formed on one substrate. Further, the various components of these devices may be a process or thread, running on one or more processors, in one or more computing devices, executing computer program instructions and interacting with other system components for performing the various functionalities described herein. The computer program instructions are stored in a memory which may be implemented in a computing device using a standard memory device, such as, for example, a random access memory (RAM). The computer program instructions may also be stored in other non-transitory computer readable media such as, for example, a CD-ROM, flash drive, or the like. Also, a person of skill in the art should recognize that the functionality of various computing devices may be combined or integrated into a single computing device, or the functionality of a particular computing device may be distributed across one or more other computing devices without departing from the spirit and scope of the exemplary embodiments of the present invention.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

Hereinafter, embodiments of the present invention will be described with reference to the attached drawings.

FIG. 1 is a block diagram illustrating a light emitting device according to an exemplary embodiment.

Referring to FIG. 1, a light emitting device 1 may include a light emitting panel 10 (alternatively, a display panel or a display part) and a panel driving part configured to drive the light emitting panel 10.

According to embodiments, the light emitting device 1 may include not only a device configured to implement an image, but also a device configured to provide light including a pattern, e.g., a particular pattern.

The light emitting panel 10 may include first to nth (where n is a positive integer) scanning lines SL1 to SLn, first to mth (where m is a positive integer) data lines DL1 to DLm, and light emitting units LU. The light emitting unit LU may be disposed at areas at which each of the first to nth scanning lines SL1 to SLn cross corresponding ones of the first to mth data lines DL1 to DLm.

The light emitting unit LU may be connected to a first voltage source QVSS and a second voltage source QVDD each having a voltage level that is variable or maintained in one frame period to be driven in a concurrent (e.g., simultaneous) light emitting method. The light emitting unit LU is described further below with reference to FIG. 1 and FIG. 2.

The panel driving part may include a scanning driving part (or scanning driver) 20, a data driving part (or data driver) 30, a power supply part (or power supply) 40, and a timing controller 50.

The scanning driving part 20 may generate scanning signals in response to a first control signal CTL1, and may provide the scanning signals to the light emitting units LU through the first to nth scanning lines SL1 to SLn. Here, the first control signal CTL1 may be provided from the timing controller 50.

The data driving part 30 may convert digital type image data to analog type data signals in response to a second control signal CTL2, and may provide the data signals to the light emitting units LU through the first to mth data lines DL1 to DLm. Here, the second control signal CTL2 may be provided from the timing controller 50.

The power supply part 40 may provide the first voltage source QVSS (alternatively, a first power voltage) and the second voltage source QVDD (alternatively, a second power voltage) to the light emitting units LU in response to a third control signal CTL3. Each of the first voltage source QVSS and/or the second voltage source QVDD may have a voltage level that is variable or maintained in one frame period. For example, the power supply part 40 may include a DC-DC converter configured to generate output voltages having various voltage levels from an input voltage, and a switch configured to select one of the output voltages as the voltage level of the first voltage source QVSS (alternatively, the voltage level of the second voltage source QVDD) in response to the third control signal CTL3.

The timing controller 50 may control the scanning driving part 20, the data driving part 30, and the power supply part 40. For example, the timing controller 50 may receive control signals CTL from an external circuit such as a system board, and may generate the first, second, and third control signals CTL1, CTL2, CTL3 in response to the control signals CTL. The first control signal CTL1 may include scanning starting signals, scanning clock signals, etc. The second control signal CTL2 may include horizontal starting signals, load signals, image data, etc. The third control signal CTL3 may include switch control signals for controlling the voltage level of each of the first voltage source QVSS and the second voltage source QVDD. The timing controller 50 may generate image data suitable for an operating condition of the light emitting panel 10 in response to input image data and provide the image data to the data driving part 30.

Figure 2:
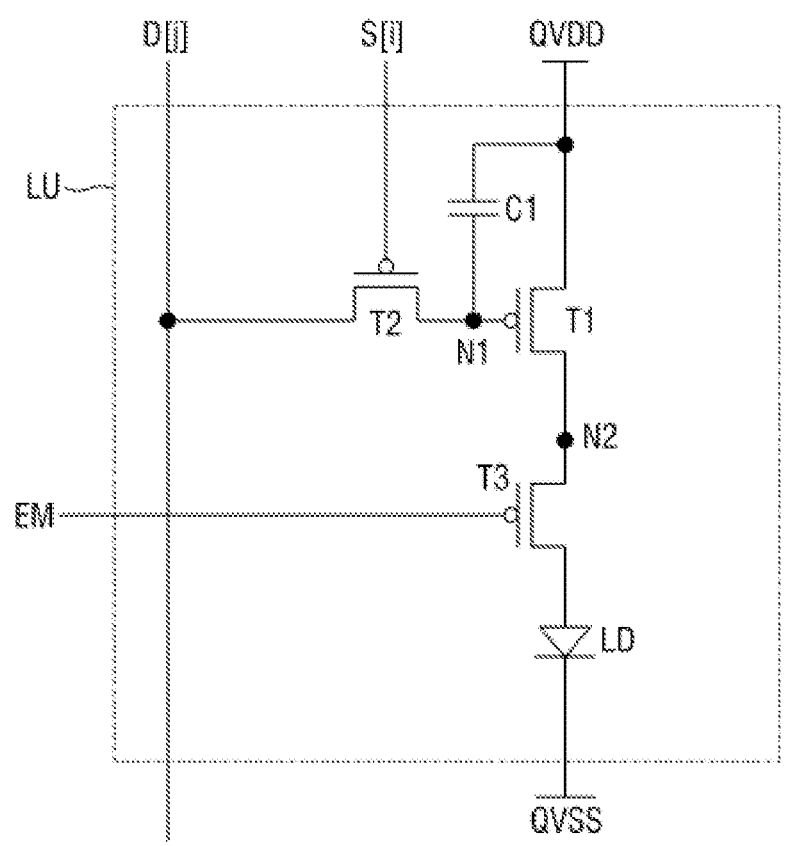
FIG. 2 is a circuit diagram illustrating an example of a light emitting unit included in the light emitting device in FIG. 1.

FIG. 2 is a circuit diagram illustrating an example of the light emitting unit LU included in the light emitting device in FIG. 1.

Referring to FIG. 2, the light emitting unit LU may include a light emitting diode LD (alternatively, a light emitting element), a first switching element T1 (alternatively, a first transistor, a driving transistor), a second switching element T2 (alternatively, a second transistor, a switching transistor), a third switching element T3 (alternatively, a third transistor, a light emitting transistor), and a first capacitor C1 (alternatively, a storage capacitor). The light emitting unit LU may be disposed at an ith row and a jth column (where i is a positive integer equal to or less than n, and j is a positive integer equal to or less than m).

Each of the first switching element T1, the second switching element T2, and the third switching element T3 may be a thin film transistor. For example, each of the first switching element T1, the second switching element T2, and the third switching element T3 may be a PMOS transistor, but the present invention is not limited thereto. As another example, at least one of the first to third switching elements T1 to T3 may be an NMOS transistor. Hereinafter, for convenience of description, an example of each of the first switching element T1, the second switching element T2, and the third switching element T3 is described as a PMOS transistor.

The first switching element T1 may include a first electrode connected to a second voltage source line to which the second voltage source QVDD is provided, a second electrode connected to a second node N2, and a gate electrode connected to a first node N1. According to embodiments, the second voltage source QVDD may be a voltage source for driving the light emitting unit LU (or required for driving the light emitting unit LU).

The second switching element T2 may include a first electrode connected to a jth data line to receive a jth data signal D[j], a second electrode connected to the first node N1, and a gate electrode connected to an ith scanning line to receive an ith scanning signal S[i].

The third switching element T3 may include a first electrode connected to the second node N2, a second electrode connected to one electrode of the light emitting diode LD, and a gate electrode connected to a light emission control line to receive a light emission control signal EM. According to embodiments, the light emission control signal EM may be provided to the light emitting unit LU from the scanning driving part 20 (alternatively, a separate emission control driving part) described with reference to FIG. 1 through a separate light emission control line.

The first capacitor C1 may be disposed between the second voltage source line to which the second voltage source QVDD is provided and the first node N1.

The light emitting diode LD may emit light in response to a driving current flowing through the first switching element T1. In an embodiment, the light emitting diode LD may include a first diode electrode connected to the second node N2, and a second diode electrode connected to a first voltage source line to which the first voltage source QVSS is provided. The light emitting diode LD may emit light in response to a current which flows from the first diode electrode to the second diode electrode.

Figure 3:
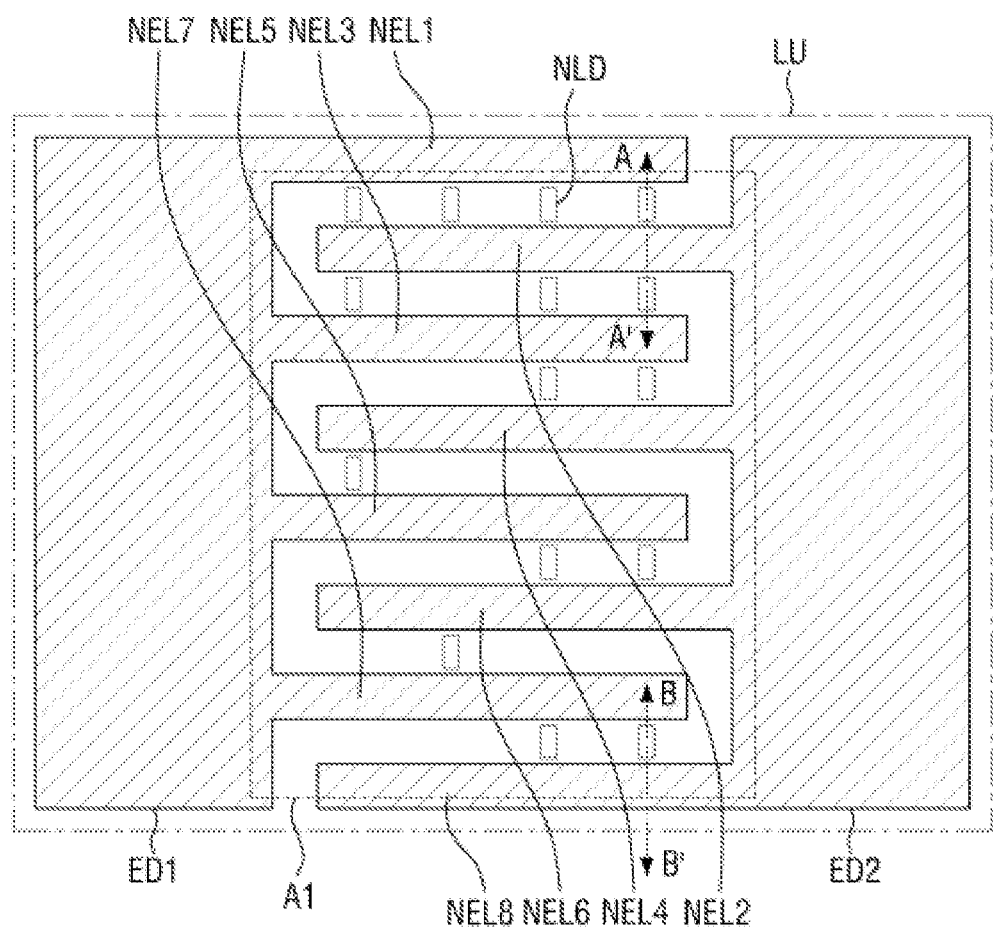
FIG. 3 is a plan view illustrating an example of the light emitting unit in FIG. 2.

The light emitting diode LD may include a fine light emitting diode NLD or may be formed from the fine light emitting diode NLD (e.g., see FIG. 3).

When a light emitting material having an inorganic crystalline structure is disposed between two electrodes facing each other, and an electric field is formed in the light emitting material in a direction (or a particular direction), the fine light emitting diode NLD may be formed because the light emitting material is arranged with a particular polarity. The fine light emitting diode NLD is described further below with reference to FIG. 3.

Although the light emitting unit LU (alternatively, a driving circuit of the light emitting unit LU) is shown in FIG. 2 to include three switching elements and one capacitor, the above is merely an example, and the present invention is not limited thereto. For example, the light emitting unit LU may or may not include other switching elements and circuit elements.

Figure 4:
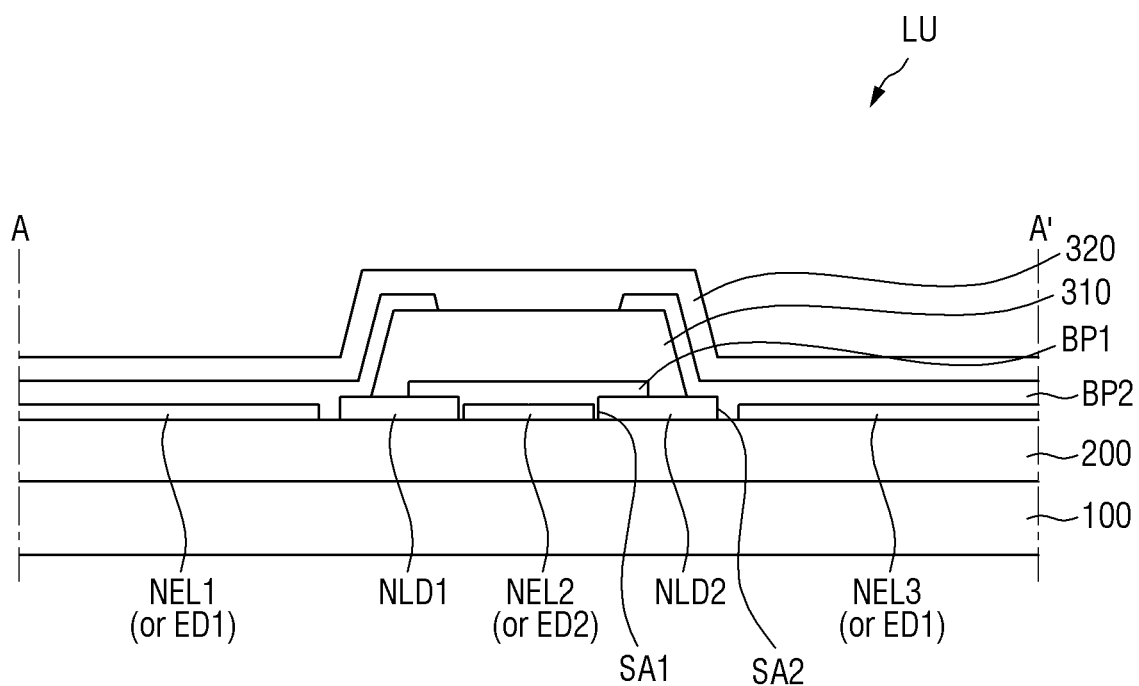
FIG. 4 is a cross-sectional view taken along the line A-A' in FIG. 3.
Figure 5:
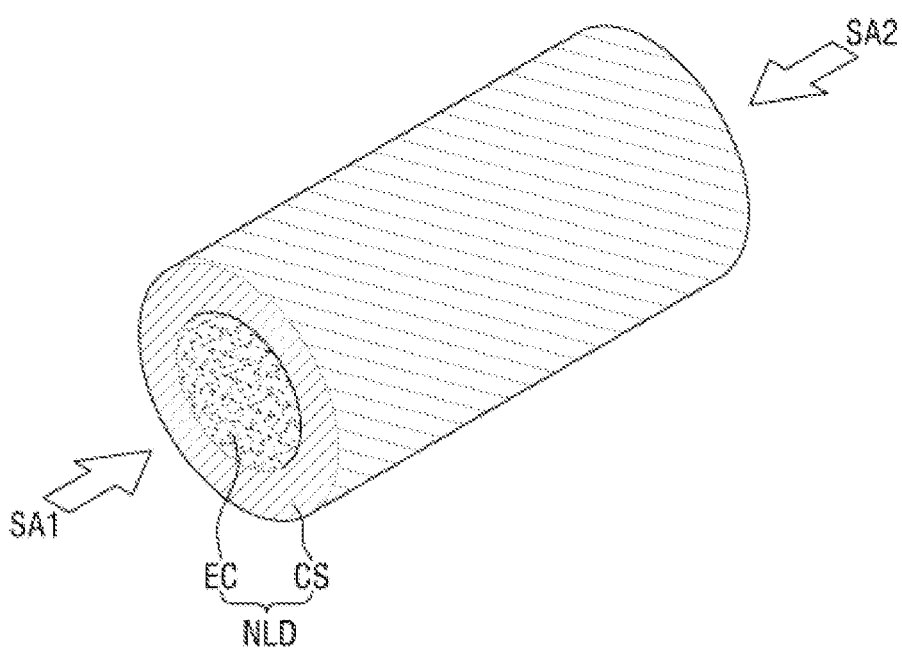
FIG. 5 is a perspective view illustrating an example of a fine light emitting diode included in a light emitting diode in FIG. 3.
Figure 6:
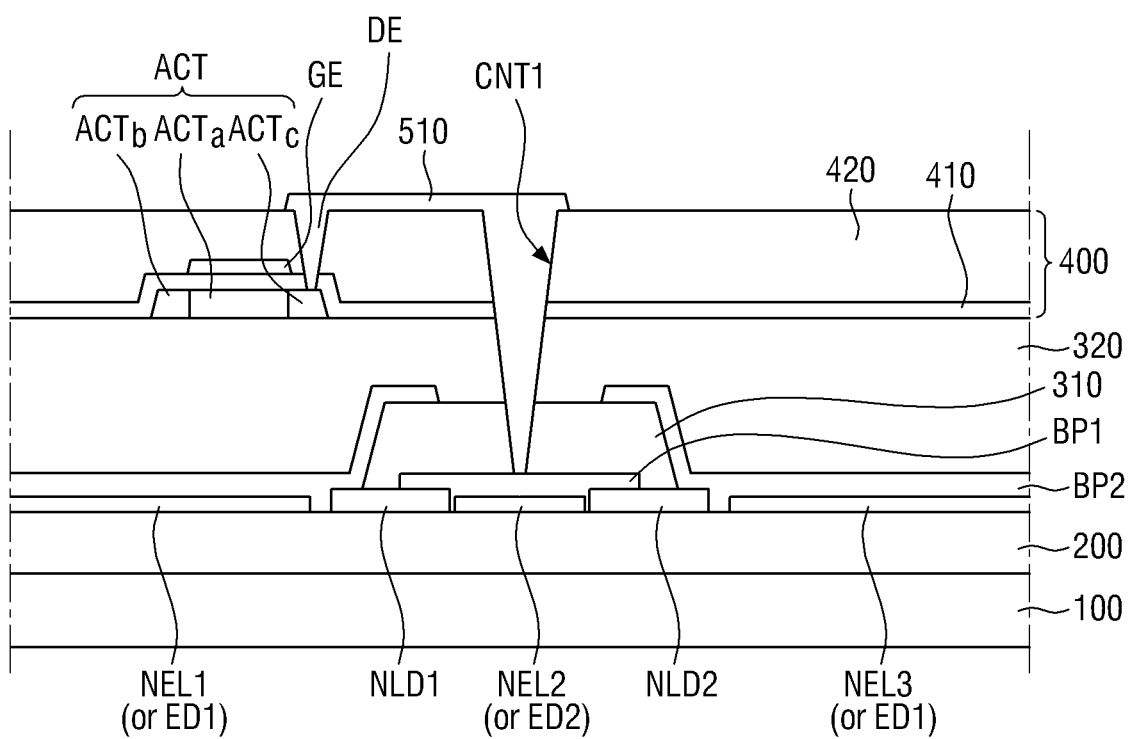
FIG. 6 is a cross-sectional view illustrating an example of the light emitting unit in FIG. 2.

FIG. 3 is a plan view illustrating an example of the light emitting unit LU in FIG. 2. FIG. 4 is a cross-sectional view taken along the line A-A' in FIG. 3. FIG. 5 is a perspective view illustrating an example of a fine light emitting diode NLD included in the light emitting diode LD in FIG. 3. FIG. 6 is a cross-sectional view illustrating an example of the light emitting unit LU in FIG. 2.

In FIG. 3, some of an area at which the light emitting diode LD is formed is shown in a plane structure of the light emitting unit LU.

Referring to FIGS. 3-6, the light emitting unit LU may include a substrate 100 (alternatively, a base layer) and a light emitting diode layer 300. The light emitting unit LU may further include a buffer layer 200 between the substrate 100 and the light emitting diode layer 300.

The substrate 100 may be formed of transparent glass or plastic. That is, the substrate 100 may be formed of a light transmissive material (e.g., a material that transmits light).

The buffer layer 200 may be disposed on (or at) the substrate 100. The buffer layer 200 may have a substantially flat upper surface. For example, electrodes ED1 and ED2 of the light emitting diode LD may be disposed on (or at) the flat surface of the buffer layer 200. The buffer layer 200 may be omitted.

The first diode electrode ED1 (alternatively, a first electrode pattern) and the second diode electrode ED2 (alternatively, a second electrode pattern) may be disposed (alternatively, stacked) on or at the buffer layer 200 (alternatively, the substrate 100). The first and second diode electrodes ED1 and ED2 may be formed with one conductive layer (for example, a first conductive layer) through one mask process.

The mask process may be a series of processes including one or more of a material layer forming process of forming a pattern to be manufactured, a process of coating a photosensitive material on the material layer, an exposing process of exposing using a mask configured to block the light at some of an area on the photosensitive material, a removing (e.g., developing) process of removing some of the photosensitive material based on an exposing pattern, a removing (e.g., etching) process of removing some of the material layer forming a pattern exposed in an upward direction and desired to be manufactured, and a removing process of removing the remaining photosensitive material.

Although some of the above-described various operations may be omitted, when the process of exposing using the mask configured to block the light is included, the process may be defined as one mask process. For example, when the pattern to be manufactured is formed of the photosensitive material, a desired pattern may be formed by three operations including photosensitive material coating, exposing, and developing, and the above may also be defined as one mask process.

The first and second diode electrodes ED1 and ED2 may be electrodes of the light emitting diode LD. For example, the first diode electrode ED1 may be an anode electrode of the light emitting diode LD, and the second diode electrode ED2 may be a cathode electrode of the light emitting diode LD. As another example, the first diode electrode ED1 may be a cathode electrode of the light emitting diode LD, and the second diode electrode ED2 may be an anode electrode of the light emitting diode LD.

The first diode electrode ED1 and the second diode electrode ED2 may be connected to a driving circuit layer 400 (for example, a transistor), described further below, or a conductive layer (for example, a voltage source line) on the driving circuit layer 400 to receive the first voltage source QVSS and the second voltage source QVDD, respectively.

As shown in FIG. 3, each of the first diode electrode ED1 and the second diode electrode ED2 may include fine electrode lines NEL1, NEL2, NEL3, NEL4, NEL5, NEL6, NEL7, and NEL8 (alternatively, fine lines or electrode lines). The fine electrode lines NEL1 to NEL8 may be disposed in a first area A1 to be parallel with each other, and the first area A1 may be an area between a main body (alternatively, a branch part) of the first diode electrode ED1 and a main body of the second diode electrode ED2. Each of the fine electrode lines NEL1 to NEL8 may have a thickness that is equal to or less than 0.5 μm corresponding to a size (for example, a width equal to or less than 0.5 μm, and a length equal to or less than 3 μm) of a fine light emitting diode NLD, described further below, and each of intervals between the fine electrode lines NEL1 to NEL8 may be equal to or less than 5 μm.

For example, the first diode electrode ED1 may include the odd numbered fine electrode lines NEL1, NEL3, NEL5, and NEL7 which extend in parallel with each other, and the second diode electrode ED2 may include the even numbered fine electrode lines NEL2, NEL4, NEL6, and NEL8 which extend in parallel with each other. Because the first to eighth fine electrode lines NEL1 to NEL8 are sequentially arranged in a particular direction, each of the even numbered fine electrode lines NEL2, NEL4, NEL6, and NEL8 (e.g., the fine electrode lines included in the second diode electrode ED2) may be alternately disposed with each of the odd numbered fine electrode lines NEL1, NEL3, NEL5, and NEL7 (e.g., the fine electrode lines included in the first diode electrode ED1).

The odd numbered fine electrode lines NEL1, NEL3, NEL5, and NEL7 may be electrically connected to each other. Similarly, the even numbered fine electrode lines NEL2, NEL4, NEL6, and NEL8 may be electrically connected to each other.

Each of the first and second diode electrodes ED1 and ED2 may be a reflective electrode, a semi-transmissive electrode, or a transmissive electrode. For example, each of the first and second diode electrodes ED1 and ED2 may be formed of a metal including molybdenum (Mo), aluminum (Al), platinum (Pt), palladium (Pd), silver (Ag), magnesium (Mg), gold (Au), nickel (Ni), neodymium (Nd), iridium (Ir), chrome (Cr), titanium (Ti), tantalum (Ta), tungsten (W), and/or copper (Cu), and/or may be formed of various conductive materials including conductive oxides and/or conductive polymers.

Although each of the first and second diode electrodes ED1 and ED2 is shown to include four fine electrode lines in FIG. 3, the above is merely an example, and the present invention is not limited thereto. For example, each of the first and second diode electrodes ED1 and ED2 may include three fine electrode lines or fewer, or five fine electrode lines or more.

The fine light emitting diode NLD may be disposed between the first diode electrode ED1 and the second diode electrode ED2 on the substrate 100.

For example, a first fine light emitting diode NLD1 may be disposed between the first fine electrode line NEL1 of the first diode electrode ED1 and the second fine electrode line NEL2 of the second diode electrode ED2, and may be repetitively disposed along a direction in which the second fine electrode line NEL2 extends. In some embodiments, the first fine light emitting diode NLD1 may refer to all of the fine light emitting diodes disposed between the first and second fine electrode lines NEL1 and NEL2. Similarly, a second fine light emitting diode NLD2 may be disposed between the third fine electrode line NEL3 of the first diode electrode ED1 and the second fine electrode line NEL2 of the second diode electrode ED2, and may be repetitively disposed along the direction in which the second fine electrode line NEL2 extends. In some embodiments, the second fine light emitting diode NLD2 may refer to all of the fine light emitting diodes disposed between the second and third fine electrode lines NEL2 and NEL3. For example, an ith fine light emitting diode NLDi may be disposed between an ith fine electrode line NELi and an ith+1 fine electrode line NELi+1.

As shown in FIG. 5, the fine light emitting diode NLD may include a light emitting material EC and a protection layer CS.

The light emitting material EC may have an inorganic crystalline structure, and may be formed in a cylindrical shape surrounded by the protection layer CS. When a current flows, the light emitting material EC may emit light (e.g., emit light at a predetermined wavelength) included in a wavelength area from ultraviolet light to visible light.

The light emitting material EC may have a structure in which a p-type semiconductor layer, an intermediate layer, and an n-type semiconductor layer are sequentially arranged.

The p-type semiconductor layer may include a semiconductor material having a compositional formula of $In_xAl_yGa_{1-x-y}N$ (here, $0 \leq x \leq 1$, $0 \leq y \leq 1$, $0 \leq x+y \leq 1$). For example, the semiconductor material may be selected from the group of GaN, AlN, AlGaN, InGaN, InN, InAlGaN, AlInN, and the like, and may include a p-type dopant such as Mg, Zn, Ca, Sr, Ba, or the like.

The n-type semiconductor layer may include a semiconductor material having a compositional formula of $In_xAl_yGa_{1-x-y}N$ (here, $0 \leq x \leq 1$, $0 \leq y \leq 1$, $0 \leq x+y \leq 1$). For example, the semiconductor material may be selected from the group of GaN, AlN, AlGaN, InGaN, InN, InAlGaN, AlInN, and the like, and may include an n-type dopant such as Si, Ge, Sn or the like.

The intermediate layer is an area at which electrons and holes are recombined, and the electrons and the holes are recombined to be transitioned to a low energy level, thereby generating light having a corresponding wavelength. The intermediate layer may include a semiconductor material having a compositional formula of $In_xAl_yGa_{1-x-y}N$ ($0 \leq x \leq 1$, $0 \leq y \leq 1$, $0 \leq x+y \leq 1$) to be formed, and may be formed in a single quantum well structure or a multi quantum well (MQW) structure. Further, the intermediate layer may have a quantum wire structure or a quantum dot structure.

The protection layer CS may be formed in a shape which is around (e.g., surrounds) a side surface of the light emitting material EC formed in the cylindrical shape, protect the light emitting material EC disposed therein, and maintain the shape of the light emitting material EC. Further, the protection layer CS may be formed of an insulating material to prevent electrical connection between the light emitting material EC and an unintended configuration.

Because the protection layer CS is formed around (e.g., to surround) a curved surface type sidewall of the light emitting material EC formed in a cylindrical shape, a first sidewall SA1 (e.g., a circular shaped first sidewall SA1) and a second sidewall SA2 (e.g., a second sidewall SA2 disposed opposite the first sidewall SA1) of the light emitting material EC may be outwardly exposed. For example, the fine light emitting diode NLD may have a cylindrical shape including one surface from which the first sidewall SA1 of the light emitting material EC is exposed, and the other surface from which the second sidewall SA2 of the light emitting material EC is exposed.

Because the p-type semiconductor layer, the intermediate layer, and the n-type semiconductor layer configuring the light emitting material EC are sequentially arranged, the first sidewall SA1 and the second sidewall SA2 may correspond to the p-type semiconductor layer and the n-type semiconductor layer, respectively. For example, the p-type semiconductor layer (alternatively, the n-type semiconductor layer) may be exposed toward the first sidewall SA1, and the n-type semiconductor layer (alternatively, the p-type semiconductor layer) may be exposed toward the second sidewall SA2.

The fine light emitting diode NLD may be injected between the first and second diode electrodes ED1 and ED2 in a state of being mixed with a special solution, and the fine light emitting diode NLD may be disposed on (or at) the buffer layer 200 (alternatively, the substrate 100) by naturally drying or removing the special solution. The fine light emitting diode NLD may be disposed between the first and second diode electrodes ED1 and ED2 due to steps between the buffer layer 200 and the first and second diode electrodes ED1 and ED2.

Further, when an electric field is formed between the first and second diode electrodes ED1 and ED2 (alternatively, the fine electrode lines NEL1 to NEL8) in a particular direction, the fine light emitting diode NLD may be arranged in a particular direction. For example, when a voltage is applied to each of the first diode electrode ED1 and the second diode electrode ED2, the fine light emitting diode NLD may be arranged so that the first sidewall SA1 of the fine light emitting diode NLD faces the second diode electrode ED2 (alternatively, the second fine electrode line NEL2) and the second sidewall SA2 of the fine light emitting diode NLD faces the first diode electrode ED1 (alternatively, the first fine electrode line NEL1 or the third fine electrode line NEL3).

A first bridge pattern BP1 (alternatively, a first contact or the second conductive layer) may be directly formed (alternatively, stacked) on the second diode electrode ED2 and the first and second fine light emitting diodes NLD1 and NLD2. The first bridge pattern BP1 may overlap the second diode electrode ED2 (alternatively, the second fine electrode line NEL2) (alternatively, may cover the second diode electrode ED2) in a cross-sectional view, and may partially overlap the first and second fine light emitting diodes NLD1 and NLD2 (alternatively, one side of each of the first and second fine light emitting diodes NDL1 and NLD2). For example, the first bridge pattern BP1 may overlap the even numbered fine electrode lines NEL2, NEL4, NEL6, NEL8 in the cross-sectional view, and may partially overlap the fine light emitting diodes NLD which are adjacent thereto.

The first bridge pattern BP1 may be formed to partially overlap the first and second fine light emitting diodes NLD1 and NLD2 to fix the first and second fine light emitting diodes NLD1 and NLD2 to the buffer layer 200 (alternatively, the substrate 100).

The first bridge pattern BP1 may be formed of a conductive material, and may electrically connect the first and second fine light emitting diodes NLD1 and NLD2 to the second diode electrode ED2. For example, the first bridge pattern BP1 may be filled between the first sidewall SA1 of each of the first and second fine light emitting diodes NLD1 and NLD2 and the second fine electrode line NEL2 to electrically connect the first and second fine light emitting diodes NLD1 and NLD2 and the second fine electrode line NEL2.

When the fine electrode lines NEL1 to NEL8 and the fine light emitting diode NLD have a similar or same thickness, a step in which the first bridge pattern BP1 is formed may be minimized or reduced, and disconnection of the first bridge pattern BP1 due to the step may be minimized or reduced.

In an embodiment, the first bridge pattern BP1 may be formed of an opaque metal material. For example, a path through which light emitted from the first and second fine light emitting diodes NLD1 and NLD2 is emitted in an upward direction may be blocked by the first bridge pattern BP1 (and a second bridge pattern BP2 of which at least a part overlaps the first bridge pattern BP1). Accordingly, the light emitting unit LU (alternatively, the light emitting panel 10 or the light emitting device 1) may emit light to a bottom surface thereof (alternatively, in a downward direction of FIG. 4), or may have a bottom emission structure.

In another embodiment, the first bridge pattern BP1 may be formed of a transparent conductive material. For example, a path through which light emitted from the first and second fine light emitting diodes NLD1 and NLD2 is emitted in an upward direction may be sufficiently secured (or provided), and the light emitting unit LU (alternatively, the light emitting panel 10 or the light emitting device 1) may emit light to a top surface (alternatively, in an upward direction of FIG. 4), or have a top emission structure.

For example, based on a light emitting direction of the light emitting unit LU, the first bridge pattern BP1 (and the second bridge pattern BP2) may be formed of an opaque metal material or a transparent conductive material.

A first passivation layer 310 (alternatively, a first insulation layer) may be formed (alternatively, stacked) on the first bridge pattern BP1. The first passivation layer 310 may be formed of an inorganic insulating material, and may insulate the first bridge pattern BP1 from the second bridge pattern BP2, described further below.

The first passivation layer 310 may overlap the first bridge pattern BP1, and may cover the whole first bridge pattern BP1 (or may cover the first bridge pattern BP1 in its entirety). As such, the first bridge pattern BP1 may not be exposed to the outside.

The first passivation layer 310 may partially overlap the first and second fine light emitting diodes NLD1 and NLD2, and may expose a portion of each of the first and second fine light emitting diodes NLD1 and NLD2 (for example, the second sidewall SA2 of each of the first and second fine light emitting diodes NLD1 and NLD2).

The second bridge pattern BP2 (alternatively, a second contact or a third conductive layer) may be disposed (alternatively, stacked) on the first diode electrode ED1 (alternatively, the first and third fine electrode lines NEL1 and NEL3) and the first and second fine light emitting diodes NLD1 and NLD2 in the cross-sectional view.

The second bridge pattern BP2 may be formed of a conductive material like the first bridge pattern BP1, and may electrically connect the first diode electrode ED1 and the first and second fine light emitting diodes NLD1 and NLD2. For example, the second bridge pattern BP2 may be filled between the second sidewall SA2 of each of the first and second fine light emitting diodes NLD1 and NLD2 and the first diode electrode ED1 (alternatively, the first and third fine electrode lines NEL1 and NEL3) to electrically connect the first and second fine light emitting diodes NLD1 and NLD2 to the first diode electrode ED1.

The second bridge pattern BP2 may be formed of the same material as that configuring the first bridge pattern BP1, and may overlap at least a portion of the first bridge pattern BP1 in a thickness direction of the substrate 100 (or in a direction orthogonal to a stacking direction of the substrate 100 and the light emitting diode layer 300). For example, the second bridge pattern BP2 may cover at least a portion of a sidewall of the first passivation layer 310, and may also be disposed on (or at) an upper surface of the first passivation layer 310. The first and second bridge patterns BP1 and BP2 may be insulated from each other by the first passivation layer 310.

For example, when the first bridge pattern BP1 is formed of an opaque metal material, the second bridge pattern BP2 may be formed of an opaque metal material. Because the second bridge pattern BP2 overlaps at least the portion of the first bridge pattern BP1, a path through which light emitted from the first and second fine light emitting diodes NLD1 and NLD2 is emitted in an upward direction may be blocked by the first and second bridge patterns BP1 and BP2. Accordingly, the light emitting unit LU (alternatively, the light emitting panel 10 or the light emitting device 1) may emit light to a bottom surface thereof.

As another example, when the first bridge pattern BP1 includes a transparent conductive material, the second bridge pattern BP2 may be formed of a transparent conductive material. Thus the light emitting unit LU (alternatively, the light emitting panel 10, the light emitting device 1) may emit light to a top surface thereof.

A second passivation layer 320 (alternatively, a second insulation layer) may have a shape and an area similar to or the same as those of the substrate 100 in a plan view, and may be disposed on (or at) the second bridge pattern BP2 in the cross-sectional view. The second passivation layer 320 may be formed of an inorganic insulating material, like the first passivation layer 310, and may protect components disposed thereunder (for example, the second bridge pattern BP2 and the like) from the outside.

As shown in FIG. 6, an upper surface of the second passivation layer 320 may be a planarization layer which is generally flat (or has a flat or substantially flat upper surface).

The driving circuit layer 400 (alternatively, an upper driving circuit layer) may be formed on the second passivation layer 320. The driving circuit layer 400 may include a transistor (e.g., the first to third transistors T1 to T3 described above with reference to FIG. 2).

A semiconductor layer including a semiconductor pattern ACT may be disposed on (or at) the second passivation layer 320. The semiconductor pattern ACT may include a channel area ACTa in which impurities are not doped, and a source area ACTb and a drain area ACTc in which impurities are doped. The source area ACTb is disposed at one side of the channel area ACTa, and electrically connected to a source electrode, and the drain area ACTc is disposed at the other side of the channel area ACTa, and electrically connected to a drain electrode DE.

A first inorganic layer 410 (alternatively, a first inorganic film or a first insulation layer) may be disposed on (or at) the semiconductor layer including the semiconductor pattern ACT. The first inorganic layer 410 may be a gate insulation layer. The first inorganic layer (or film) 410 (and a second inorganic layer (or film) 420, described further below) may be formed of one or a mixture of one or more selected from the group consisting of inorganic insulating materials such as silicon oxide (SiOx), silicon nitride (SiNx), and the like, and organic insulating materials such as BCB (benzocyclobutene), an acrylic-based material, and/or polyimide.

A gate conductor including a gate electrode GE may be disposed on (or at) the first inorganic layer 410. The gate electrode GE may overlap the semiconductor pattern ACT. The gate conductor may include at least one of an aluminum (Al)-based metal including an aluminum (Al) alloy, a silver (Ag)-based metal including a silver (Ag) alloy, a copper (Cu)-based metal including a copper (Cu) alloy, a molybdenum (Mo)-based material including a molybdenum (Mo) alloy, chrome (Cr), titanium (Ti), and tantalum (Ta).

The second inorganic layer 420 (alternatively, a second inorganic film or a second insulation layer) may be disposed on (or at) the gate conductor including the gate electrode GE.

A data conductor 510 (alternatively, a conductive pattern, a data pattern, or a wiring pattern) including the source electrode and the drain electrode DE may be disposed on (or at) the second inorganic layer 420. The data conductor 510 may include at least one selected from the group consisting of a metal, an alloy, a metal nitride, a conductive metal oxide, and a transparent conductive material.

A contact hole (or contact opening) configured to pass through the first and second inorganic layers 410 and 420 to expose the semiconductor pattern ACT may be formed in an area at which the data conductor 510 and the semiconductor pattern ACT overlap each other, and the data conductor 510 may come into contact with the semiconductor pattern ACT through the contact opening (e.g., the contact hole) to form one electrode (for example, the drain electrode DE) of a transistor.

A first contact hole (or first contact opening) CNT1 configured to pass through the first and second inorganic layers 410 and 420, and the second passivation layer 320 (and the first passivation layer 310) may be formed in an area at which the data conductor 510 and the second diode electrode ED2 (alternatively, the second fine electrode line NEL2) overlap each other, and the data conductor 510 may be electrically connected to the second diode electrode ED2 through the first contact opening CNT1.

As described above with reference to FIGS. 3-6, the light emitting unit LU may have a bottom emission structure. As discussed further below with reference to FIGS. 20A-20E, the light emitting unit LU (and the light emitting panel 10) may be manufactured through a relatively simple manufacturing process (for example, a mask process of which times are relatively reduced) based on a stacking structure of the light emitting unit LU.

Further, the substrate 100 (and the buffer layer 200) disposed on (or at) the bottom surface of the light emitting unit LU may be relatively flat or have a relatively flat lower surface so that a functional film (for example, a polarizing film configured to block external light) may be attached to a display surface of the light emitting panel 10 (e.g., the bottom surface of the light emitting unit LU) without steps (or without introducing a step in the functional film). For reference, when the light emitting panel has a top emission structure, the functional film is attached to a top surface (alternatively, an upper surface) of the light emitting panel, but because the second passivation layer 320 forming the upper surface has a relatively non-uniform thickness, and the upper surface of the second passivation layer 320 is not relatively flat, a stain phenomenon (for example, a phenomenon in which the stain is shown in a display image) may be generated.

FIGS. 7-10 are cross-sectional views illustrating various embodiments of the light emitting unit in FIG. 2.

Figure 7:
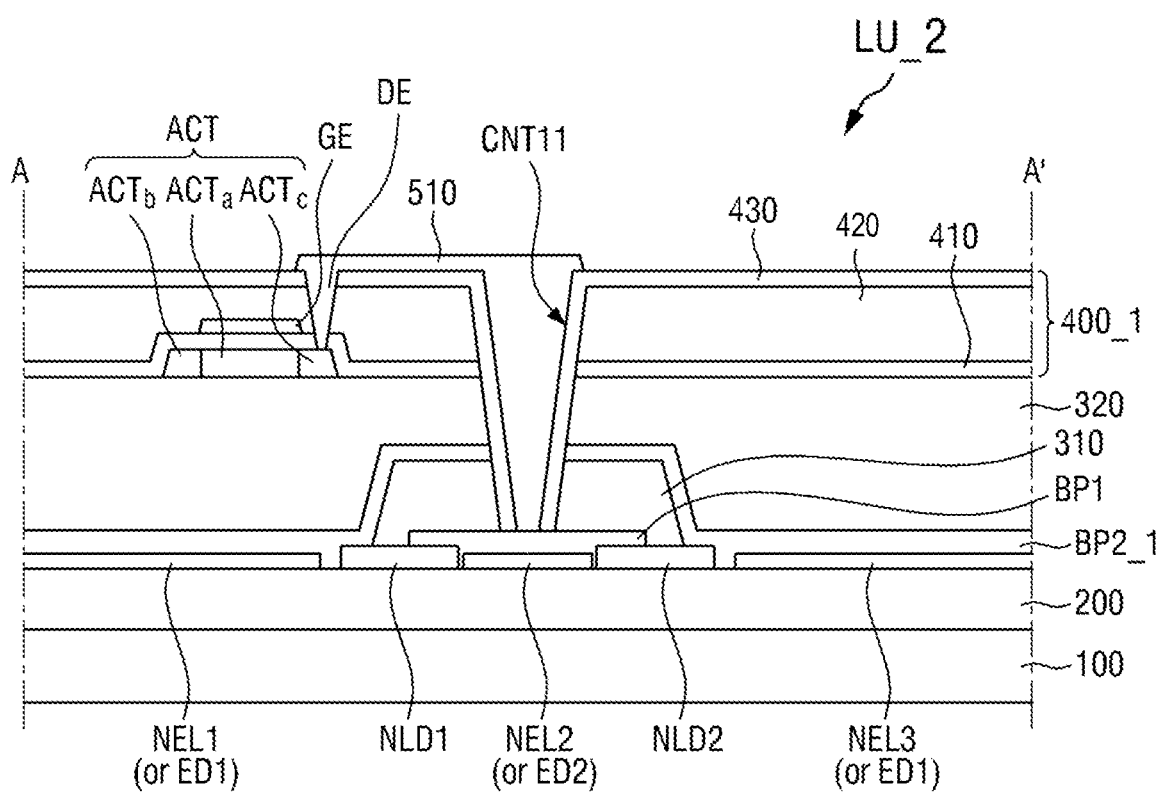
FIGS. 7-10 are cross-sectional views illustrating various embodiments of the light emitting unit in FIG. 2.

First, referring to FIG. 7, a light emitting unit LU_2 includes a second bridge pattern BP2_1 and a driving circuit layer 400_1.

The second bridge pattern BP2_1 is similar to the second bridge pattern BP2 described above with reference to FIG. 4, but may overlap the first passivation layer 310 in the cross-sectional view and may completely (or entirely) cover the first passivation layer 310.

As described above with reference to FIG. 4, the second bridge pattern BP2_1 may be formed of an opaque metal material, and in some embodiments, light emitted from the first and second fine light emitting diodes NLD1 and NLD2 to an upper surface of the second bridge pattern BP2_1 may be blocked by the second bridge pattern BP2_1. In some embodiments, the second bridge pattern BP2_1 may be formed of a reflective material, and thus bottom emission efficiency of the light emitting unit LU may be enhanced. For example, the reflective material may include at least one selected from the group consisting of silver (Ag), magnesium (Mg), chrome (Cr), gold (Au), platinum (Pt), nickel (Ni), copper (Cu), tungsten (W), aluminum (Al), aluminum-lithium (Al—Li), magnesium-indium (Mg—In), and/or magnesium-silver (Mg—Ag).

The driving circuit layer 400_1 may further include a third inorganic layer 430 (alternatively, a third inorganic film or a third insulation layer). The third inorganic layer 430 may be disposed on (or at) the second inorganic layer 420. An eleventh contact hole (or eleventh contact opening) CNT11 configured to pass through the first and second inorganic layers 410 and 420, the first and second passivation layers 310 and 320, and the second bridge pattern BP2_1 to form the first bridge pattern BP1 may be formed in an area at which the third inorganic layer 430 and the second diode electrode ED2 (alternatively, the second fine electrode line NEL2) overlap each other. For example, the third inorganic layer 430 may be disposed on (or at) an entire inner side surface of the eleventh contact opening CNT11 (or on an inner side surface of the eleventh contact hole CNT11 in its entirety) and may insulate the data conductor 510 and the second bridge pattern BP2_1 from each other.

For example, the second bridge pattern BP2_1 may be formed of an opaque metal material (alternatively, a reflective material), and may block any path of light in the upward direction with respect to the first and second fine light emitting diodes NLD1 and NLD2 to further enhance bottom emission efficiency of the light emitting panel 10 (alternatively, the light emitting unit LU).

Figure 8:
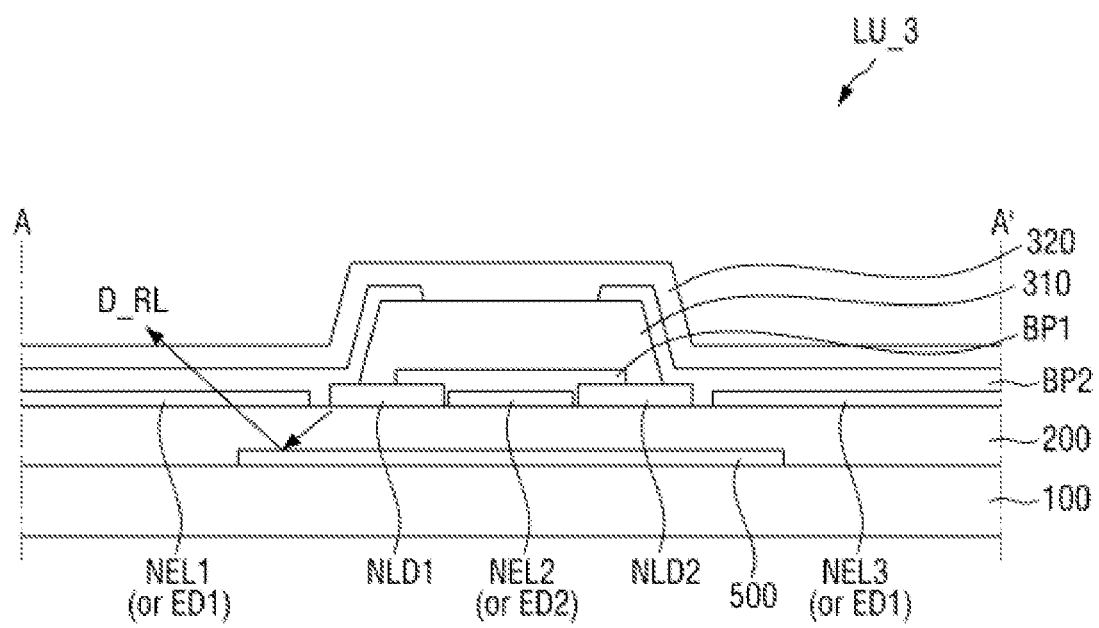

Referring to FIG. 8, a light emitting unit LU_3 further includes a reflection layer 500. The light emitting unit LU_3 may emit light to a top surface (alternatively, an upper surface) thereof, and may include the driving circuit layer 400 shown in FIG. 6.

The reflection layer 500 may be interposed between the substrate 100 and the buffer layer 200. For example, the reflection layer 500 may be formed on the substrate 100, and the buffer layer 200 may be formed on the reflection layer 500 in a manufacturing process of the light emitting panel 10.

The reflection layer 500 may be formed of a reflective material, for example, a reflective film including silver (Ag), nickel (Ni), cobalt (Co), or the like.

The reflection layer 500 may overlap the first and second fine light emitting diodes NLD1 and NLD2. For example, because light emitted in a downward direction from the fine light emitting diode NLD is reflected by the reflection layer 500, and the reflected light is emitted in an upward direction (for example, a reflection direction D_RL) from the light emitting unit LU_3, top emission efficiency of the light emitting unit LU_3 may be enhanced.

In an embodiment, the reflection layer 500 may be disposed to overlap the first area A1 shown in the plan view in FIG. 3. For example, the reflection layer 500 may partially overlap the first fine electrode line NEL1 (and the eighth fine electrode line NEL8), and may overlap the second fine electrode line NEL2 (and the third to seventh fine electrode lines NEL3 to NEL7). When the reflection layer 500 overlaps the light emitting unit LU, because light emitted in a downward direction from the fine light emitting diode NLD is reflected by the reflection layer 500, and emitted in an upward direction through an area at which an adjacent light emitting unit (e.g., a light emitting unit adjacent to the light emitting unit LU_3) is disposed, the light may be emitted to an undesired area (e.g., the area at which the adjacent light emitting unit is disposed). Accordingly, the reflection layer 500 may be disposed to partially overlap the light emitting unit LU_3.

A distance in which the reflection layer 500 protrudes with respect to the first fine light emitting diode NLD1 (alternatively, a fine light emitting diode NLD disposed adjacent to an edge of the light emitting unit LU_3), may be less than half of a distance from the first fine light emitting diode NLD1 to the adjacent light emitting unit (alternatively, the area at which the adjacent light emitting unit is disposed).

The reflection layer 500 may partially overlap the first fine electrode line NEL1 as shown in FIG. 8, but the present invention is not limited thereto. For example, the reflection layer 500 may overlap the fine light emitting diode NLD in the thickness direction, and may not overlap some fine electrode lines NEL (for example, the first fine electrode line NEL1).

Figure 9:
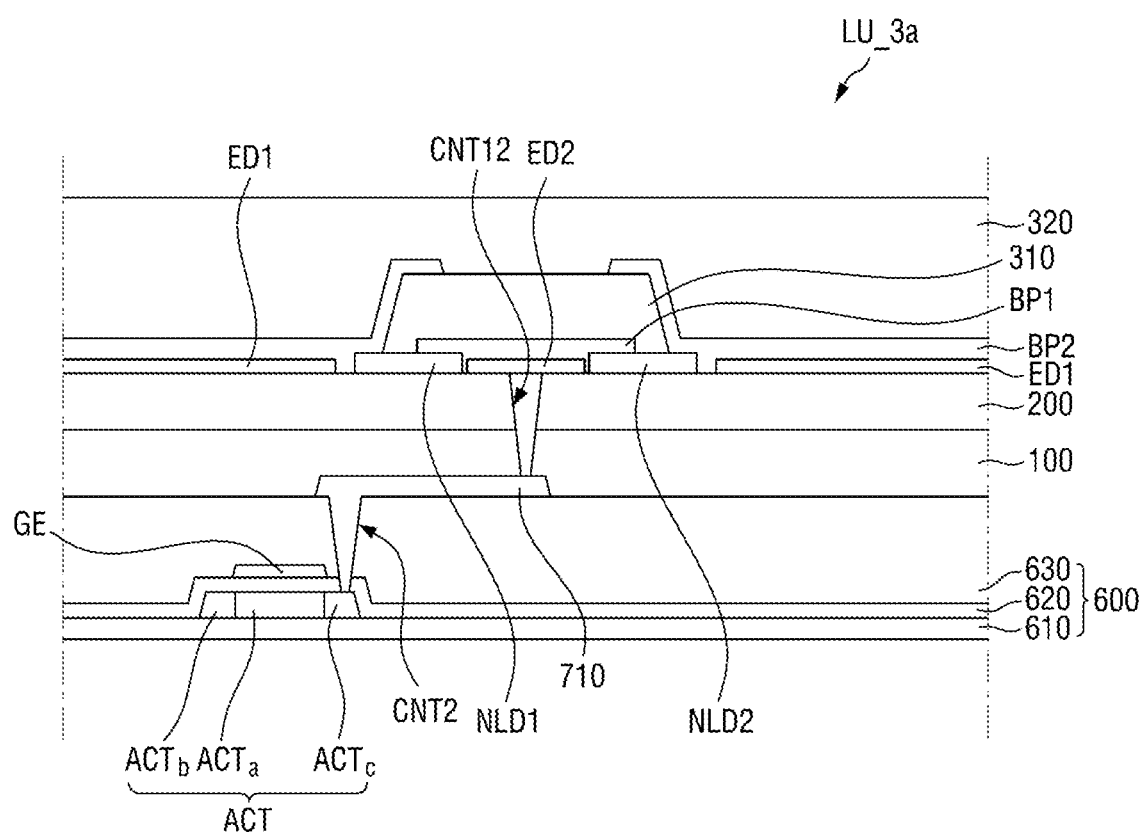

Referring to FIG. 9, a light emitting unit LU_3a includes a driving circuit layer 600.

The driving circuit layer 600 may be disposed under the substrate 100. The driving circuit layer 600 may include a base substrate 610, a semiconductor layer (e.g., a semiconductor layer including a semiconductor pattern ACT), a first insulation layer (or a first inorganic layer) 620, a gate conductor including a gate electrode GE, and a second insulation layer (or a second inorganic layer) 630. The driving circuit layer 600 may be substantially the same as the driving circuit layer 400 described above with reference to FIG. 6 except for a location thereof. Accordingly, repetitive descriptions may be omitted.

In a manufacturing process of the light emitting panel 10 according to embodiments, the driving circuit layer 600 may be formed first, and the diode electrodes ED1 and ED2, the fine light emitting diode NLD, the first bridge pattern BP, and the like may be sequentially formed on the driving circuit layer 600.

A data conductor 710 may be disposed or formed between the second insulation layer 630 and the substrate 100, a second contact hole (or a second contact opening) CNT2 configured to pass through the second insulation layer 630 to expose one electrode of the transistor may be formed in an area at which the data conductor 710 and one electrode of the transistor overlap each other, and the data conductor 710 may be in contact with the semiconductor pattern ACT through the second contact opening CNT2 to configure one electrode of the transistor. Similarly, a twelfth contact hole (or second contact opening) CNT12 configured to pass through the substrate 100 and the buffer layer 200 may be formed in an area at which the data conductor 710 and the second diode electrode ED2 (alternatively, the second fine electrode line NEL2) overlap each other, and the data conductor 710 may be electrically connected to the second diode electrode ED2 through the twelfth contact opening CNT12.

When the light emitting unit LU_3a emits light to a top surface thereof, one selected from the base substrate 610, the first insulation layer 620, the second insulation layer 630, the substrate 100, and the buffer layer 200 may include a reflective material. In some embodiments, the reflection layer 500 (described above with reference to FIG. 8) may be interposed between two selected from the base substrate 610, the first insulation layer 620, the second insulation layer 630, the substrate 100, and the buffer layer 200. For example, like FIG. 8, the reflection layer 500 may be interposed between the substrate 100 and the buffer layer 200, and the reflection layer 500 may be disposed at a partial area of the light emitting unit LU_3a in the plan view.

In some embodiments, when the light emitting unit LU_3a emits light to a bottom surface thereof, as described above with reference to FIG. 4, each of the first bridge pattern BP1 and the second bridge pattern BP2 may be formed of an opaque metal material or a reflective material, and the second bridge pattern BP2 may overlap at least a part of the first bridge pattern BP1 in the thickness direction.

In some embodiments, the light emitting unit LU_3a may include the substrate 100 as illustrated in FIG. 9, but the present invention is not limited thereto. For example, the substrate 100 may include the driving circuit layer 600, or may be omitted.

Figure 10:
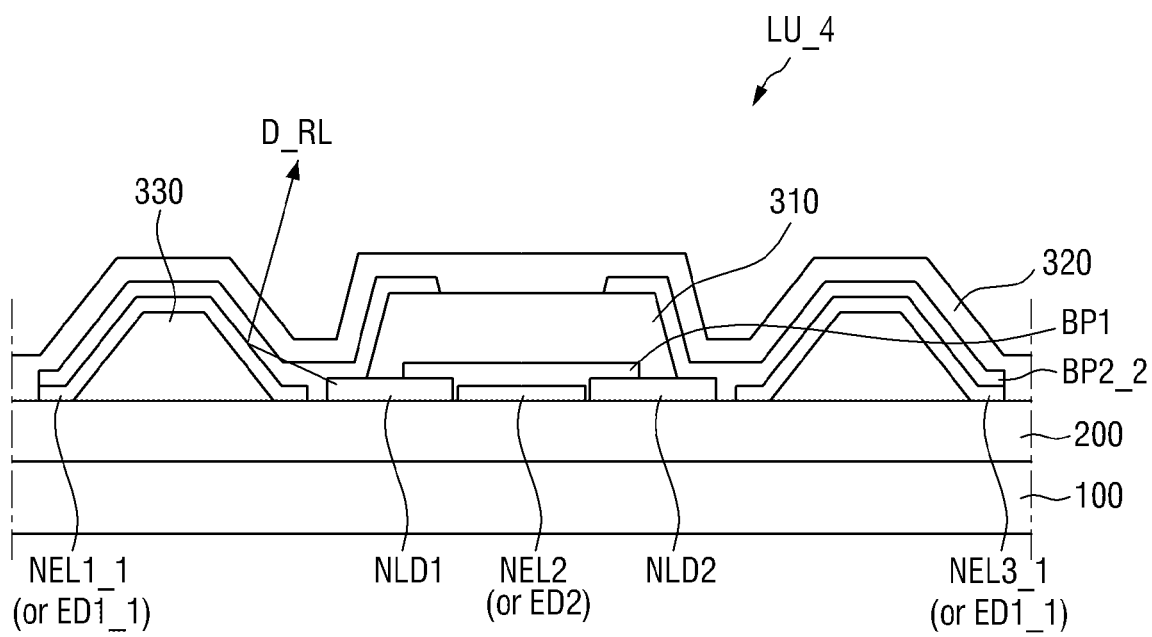

Referring to FIG. 10, a light emitting unit LU_4 further includes a partition 330.

The partition 330 may overlap the first diode electrode ED1 (alternatively, the first and third fine electrode lines NEL1 and NEL3) in the thickness direction, and may be interposed between the buffer layer 200 and the first diode electrode ED1. The partition 330 may not overlap the second diode electrode ED2 (alternatively, the second fine electrode line NEL2). The first passivation layer 310 formed on the first bridge pattern BP1 may have a thickness (or a height) in the thickness direction similar to or the same as that of the partition 330. The second passivation layer 320 may have a uniform thickness, and an upper surface of the second passivation layer 320 may be relatively easy to be flattened.

The partition 330 may be disposed on (or at) the buffer layer 200 in the manufacturing process of the light emitting panel 10. The first diode electrode ED1 may be disposed along a sidewall of the partition 330. When the first diode electrode ED1 is formed of a reflective material, top emission efficiency of the light emitting unit LU_4 may be enhanced. However, the manufacturing process is not limited to the above, and the partition 330 instead of the first diode electrode ED1 may be formed of a reflective material, for example.

In some embodiments, the partition 330 may overlap the first diode electrode ED1, as shown in FIG. 10, but the present invention is not limited thereto. For example, the partition 330 may also be formed to overlap the second diode electrode ED2. As such, the top emission efficiency of the light emitting unit LU_4 may be further enhanced.

Figure 11:
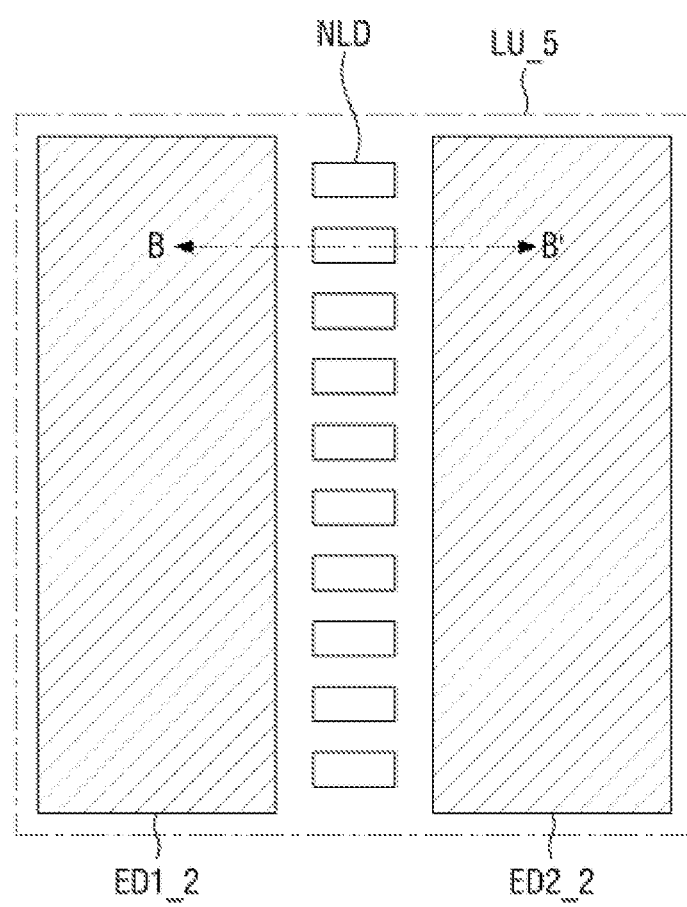
FIG. 11 is a plan view illustrating an example of the light emitting unit in FIG. 2.
Figure 12:
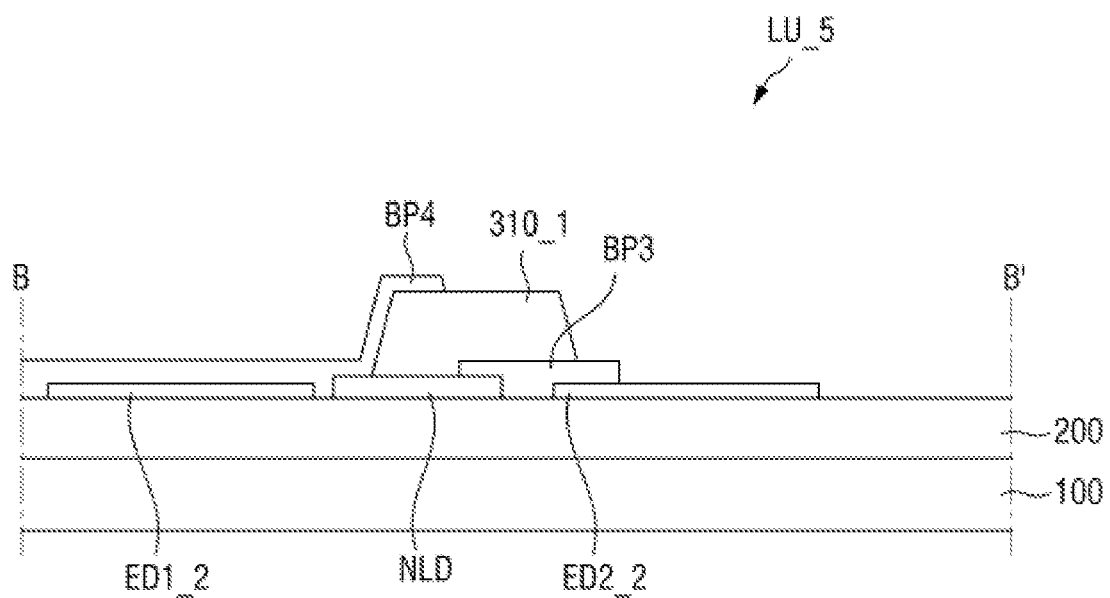
FIG. 12 is a cross-sectional view taken along the line B-B' in FIG. 11.

FIG. 11 is a plan view illustrating an example of the light emitting unit LU in FIG. 2. FIG. 12 is a cross-sectional view taken along the line B-B' in FIG. 11.

Referring to FIGS. 2, 4, 11, and 12, a light emitting unit LU_5 includes first and second diode electrodes ED1_2 and ED2_2. Each of the first and second diode electrodes ED1_2 and ED2_2 does not include fine electrode lines, in contrast to the first and second diode electrodes ED1 and ED2 described with reference to FIGS. 2 and 4.

The first and second diode electrodes ED1_2 and ED2_2 (alternatively, the first conductive layer including the electrode pattern) may be formed on the buffer layer 200 (alternatively, the substrate 100).

The fine light emitting diode NLD may be disposed between the first and second diode electrodes ED1_2 and ED2_2 on the buffer layer 200.

A third bridge pattern BP3 (alternatively, the first contact, the second conductive layer) may be directly formed (alternatively, stacked) on the second diode electrode ED2_2 and the fine light emitting diode NLD. The third bridge pattern BP3 may partially overlap the second diode electrode ED2_2 and the fine light emitting diode NLD in the cross-sectional view.

The third bridge pattern BP3 may be formed of a conductive material and electrically connect the fine light emitting diode NLD and the second diode electrode ED2_2.

The third bridge pattern BP3 may be formed to partially overlap the fine light emitting diode NLD to fix the fine light emitting diode NLD to the buffer layer 200 (alternatively, the substrate 100).

A first passivation layer 310_1 (alternatively, the first insulation layer) may be formed (alternatively, stacked) on the third bridge pattern BP3. The first passivation layer 310_1 may partially overlap the fine light emitting diode NLD, and may expose at least a part of the fine light emitting diode NLD (for example, the second sidewall SA2 of the fine light emitting diode NLD described with reference to FIG. 5.) The first passivation layer 310_1 may be formed of an inorganic insulating material, and may insulate the third bridge pattern BP3 from a fourth bridge pattern BP4.

The fourth bridge pattern BP4 (alternatively, the second contact or the second conductive layer) may be disposed (alternatively, stacked) on the first diode electrode ED1_1 and the fine light emitting diode NLD in the cross-sectional view.

The fourth bridge pattern BP4 may be formed of a conductive material, and may electrically connect the fine light emitting diode NLD to the first diode electrode ED1_1.

Similar to the second passivation layer 320 described with reference to FIG. 4, a second passivation layer may be disposed on (or at) the fourth bridge pattern BP4. The second passivation layer may have a shape and an area similar to or the same as a shape and an area of the substrate 100, and may completely cover components disposed thereunder to protect the components from the outside.

Further, the light emitting unit LU_5 may include the driving circuit layer 400 (alternatively, an upper driving circuit layer) described with reference to FIG. 6, and may emit light to a bottom surface thereof. However, the light emitting unit LU_5 is not limited thereto, and for example, the light emitting unit LU_5 may include the driving circuit layer 600 (alternatively, a lower driving circuit layer) described with reference to FIG. 9, and may emit light to a top surface thereof. Further, the light emitting unit LU_5 may further include the reflection layer 500 described with reference to FIG. 8. In some embodiments, the light emitting unit LU_5 may emit light to the top surface thereof, and may have enhanced top emission efficiency.

As described above, the light emitting unit LU_5 may include a single fine light emitting diode NLD (alternatively, a column of fine light emitting diodes NLD), and may have a bottom emission structure. Thus the light emitting unit LU_5 may be manufactured through a relatively simple manufacturing process (for example, a mask process of which times are relatively reduced).

Further, because the substrate 100 (and the buffer layer 200) disposed on (or at) a bottom surface of the light emitting unit LU_5 is relatively flat or has a relatively flat lower surface, the functional film (for example, a polarizing film configured to block external light) may be attached without the need for steps, and thus a stain phenomenon due to the functional film and the like may not be generated, or the likelihood thereof may be reduced.

FIG. 12 may be substantially the same as the cross-section along the line B-B' in FIG. 3. For example, the one side of the light emitting unit LU described with reference to FIGS. 1-6 may have a cross-sectional structure described with reference to FIG. 12.

FIGS. 13-19 are cross-sectional views illustrating various embodiments of the light emitting unit LU in FIG. 11.

Figure 13:
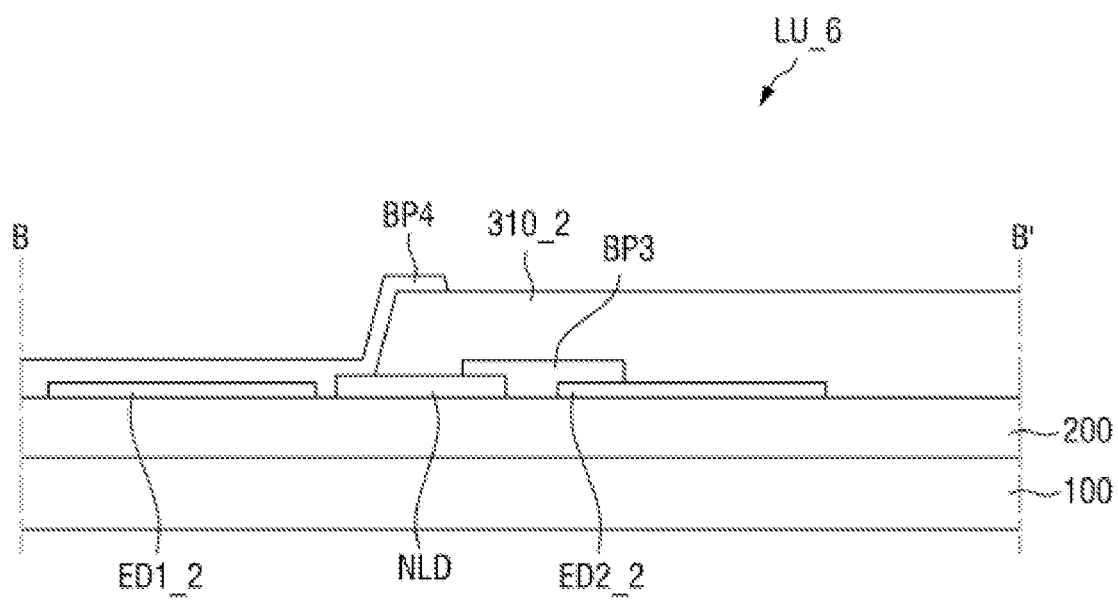
FIGS. 13-19 are cross-sectional views illustrating various embodiments of the light emitting unit in FIG. 11.

Referring to FIG. 13, a light emitting unit LU_6 includes a first passivation layer 310_2.

The first passivation layer 310_2 may be substantially the same as the first passivation layer 310_1 described with reference to FIG. 12. Accordingly, repetitive descriptions thereof may be omitted.

The first passivation layer 310_2 may be disposed on (or at) the fine light emitting diode NLD, the third bridge pattern BP3, and the second diode electrode ED2_2 in the cross-sectional view. The first passivation layer 3102 may overlap the second diode electrode ED2_2 in the thickness direction, and may cover the second diode electrode ED2_2.

Figure 14:
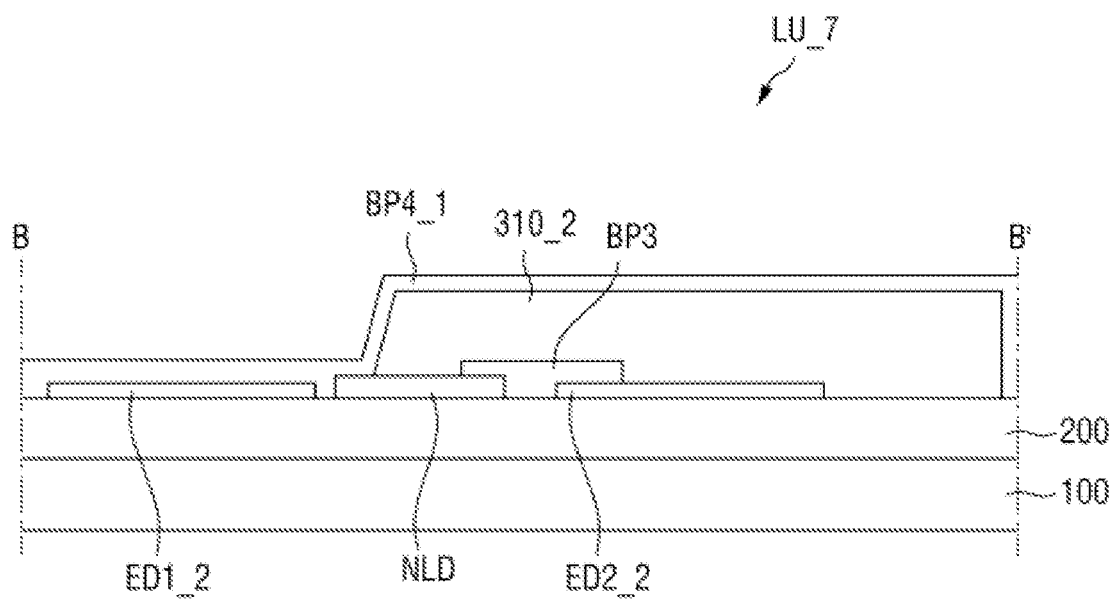

Referring to FIG. 14, a light emitting unit LU_7 includes a fourth bridge pattern BP4_1.

The fourth bridge pattern BP4_1 may overlap and cover the first passivation layer 310_2. Both ends of the fourth bridge pattern BP4_1 may be in contact with the buffer layer 200 in the cross-sectional view.

The fourth bridge pattern BP4_1 may include an opaque metal material, and thus the light emitting unit LU_7 may emit light to a bottom surface thereof. Further, the fourth bridge pattern BP4_I1 may include a reflective material, and thus all light emitted in an upward direction with respect to the fine light emitting diode NLD is reflected in a downward direction by the fourth bridge pattern BP4_1, and accordingly, bottom emission efficiency of the light emitting unit LU_7 may be further enhanced.

Figure 15:
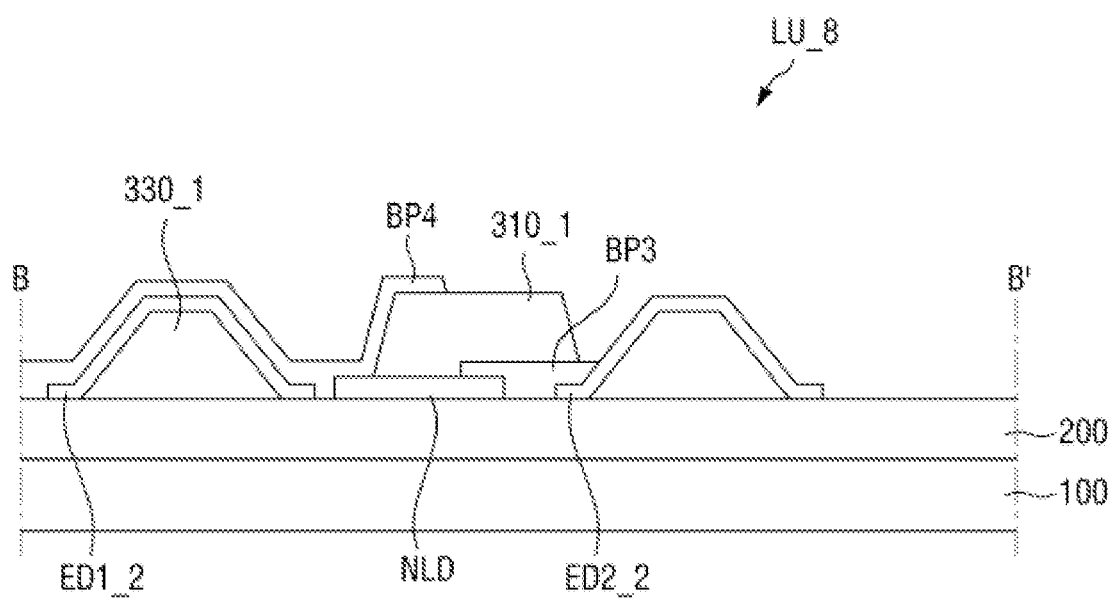

Referring to FIG. 15, a light emitting unit LU_8 includes a partition 330_1.

The partition 330_1 may be substantially the same as the partition 330 described above with reference to FIG. 10, except for a location thereof.

The partition 330_1 may be disposed to overlap the first diode electrode ED1_2 and the second diode electrode ED2_2. When the first and second diode electrodes ED1_2 and ED2_2 formed along a sidewall of the partition 330_1 are formed of a reflective material, or include the reflective material, top emission efficiency of the light emitting unit LU_8 may be further enhanced. The top emission efficiency of the light emitting unit LU_8 may be further enhanced even when the partition 330_1, instead of the first and second diode electrodes ED1_2 and ED2_2, includes the reflective material.

Figure 16:
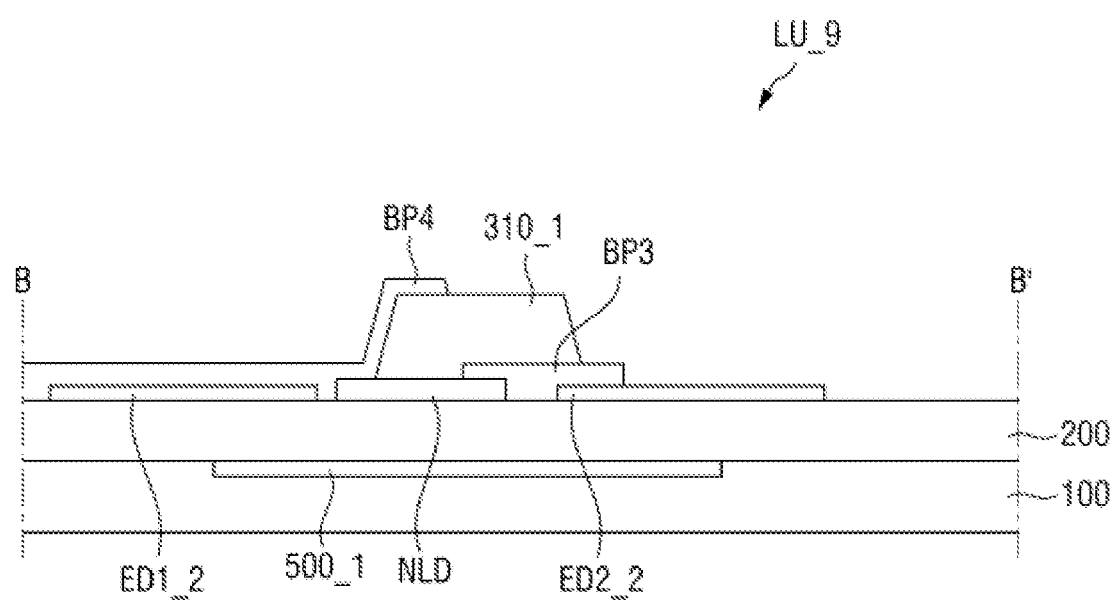

Referring to FIG. 16, a light emitting unit LU_9 further includes a reflection layer 500_1.

The reflection layer 500_1 may be substantially the same as the reflection layer 500 described with reference to FIG. 8 and thus repetitive descriptions thereof may be omitted.

The reflection layer 500_1 may overlap the fine light emitting diode NLD in the thickness direction, and may partially overlap the first and second diode electrodes ED1_2 and ED2_2. As described above with reference to FIG. 8, the reflection layer 500_1 may be disposed at a part of the light emitting unit LU_9 in the plan view to prevent emission of light, which is emitted in a downward direction by the fine light emitting diode NLD and reflected by the reflection layer 500_1, through an adjacent light emitting area (e.g., an area at which the light emitting unit adjacent to the light emitting unit LU_9 is disposed). For example, as described above with reference to FIG. 8, a length in which the reflection layer 500_1 protrudes with respect to the fine light emitting diode NLD may be half or less of a length from the fine light emitting diode NLD to the adjacent light emitting area.

The light emitting unit LU_9 may emit light to a top surface thereof due to the reflection layer 500_1.

Figure 17:
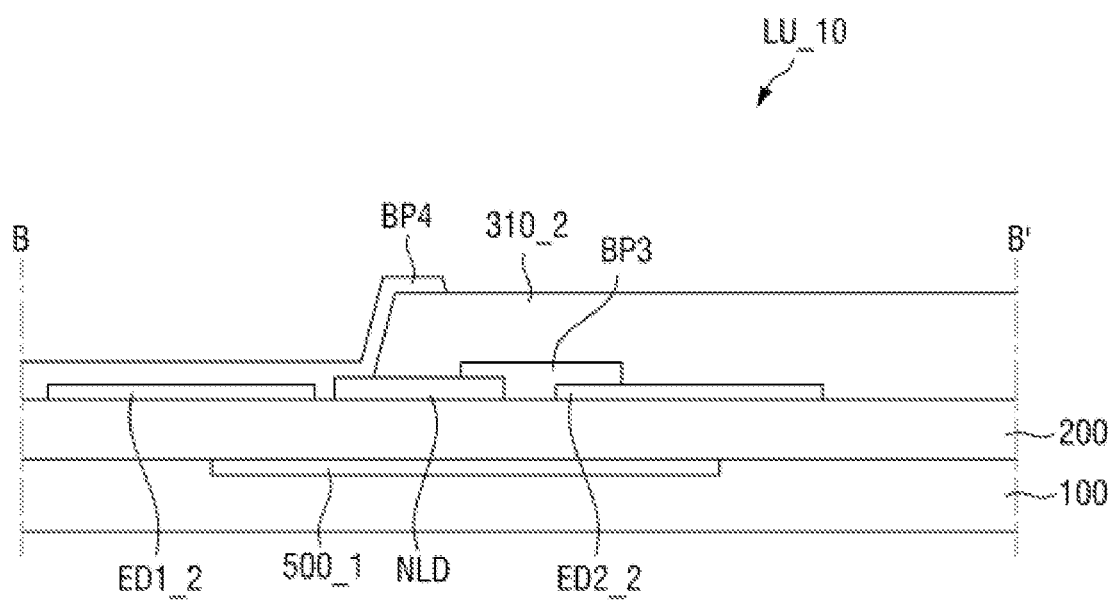
Figure 18:
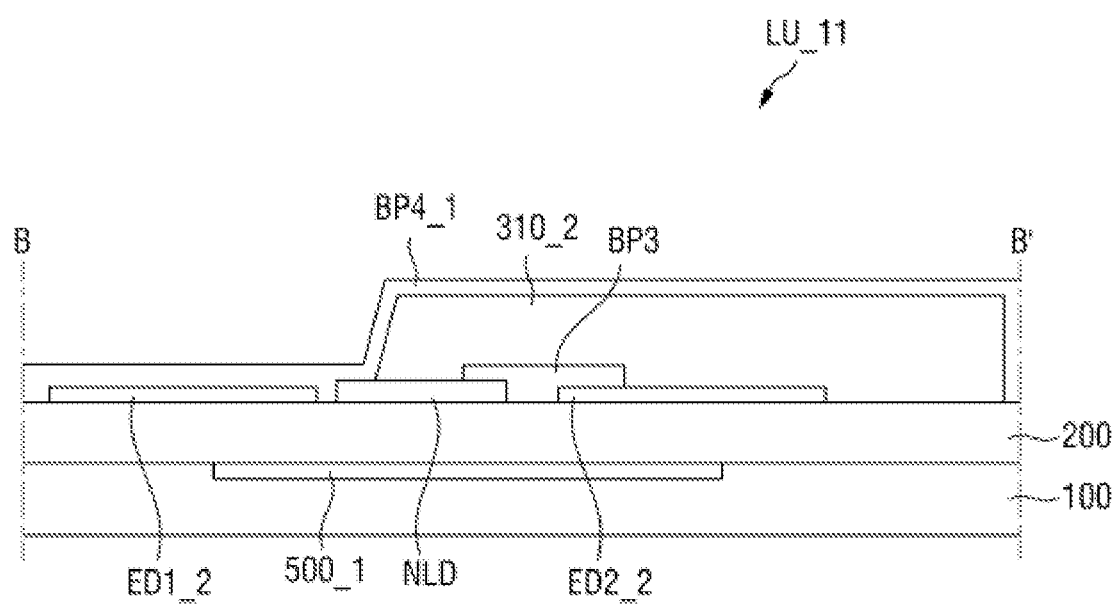
Figure 19:
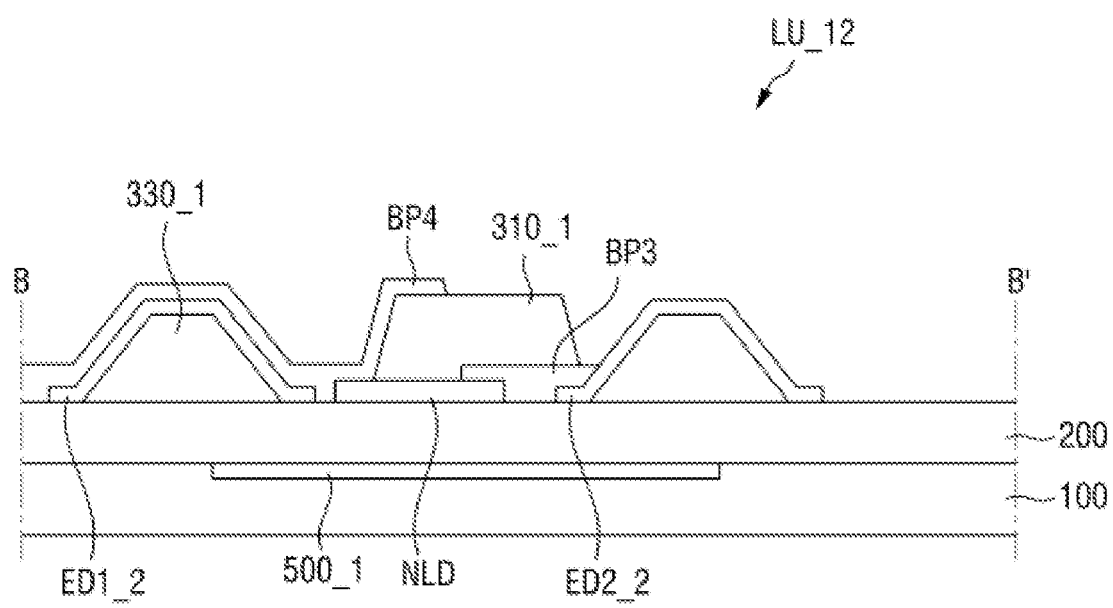

Referring to FIGS. 17-19, each of the light emitting units LU_10, LU_11, and LU_12 further includes the reflection layer 500_1. Each of the light emitting units LU_10, LU_11, and LU_12 may emit light to the top surface thereof due to the reflection layer 500_1, and have the further enhanced top emission efficiency.

FIGS. 20A-20E are cross-sectional views for describing a method of manufacturing the light emitting device in FIG. 1. FIGS. 20A-20E show a cross-section in which the light emitting unit LU is cut along the line A-A' shown in FIG. 3 in a process order.

Figure 20A:
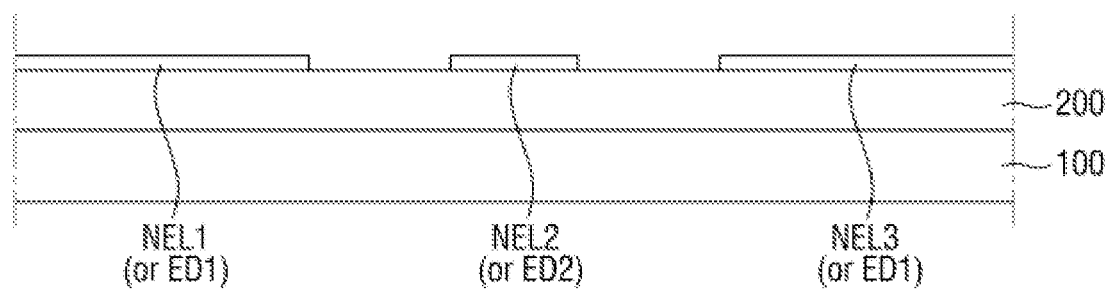
FIGS. 20A-20E are cross-sectional views for illustrating a method of manufacturing the light emitting device in FIG. 1.

First, referring to FIG. 20A, a substrate 100 may be provided, and a buffer layer 200 may be stacked on the substrate 100. Further, a first conductive layer including a first diode electrode ED1 and a second diode electrode ED2 may be formed on the buffer layer 200. The first conductive layer may be formed through one mask process (for example, a first mask process).

Because the light emitting unit LU has a bottom emission structure, a process of forming a separate partition (for example, a mask process of forming the partition) may not be included before the process of forming the first conductive layer.

Figure 20B:
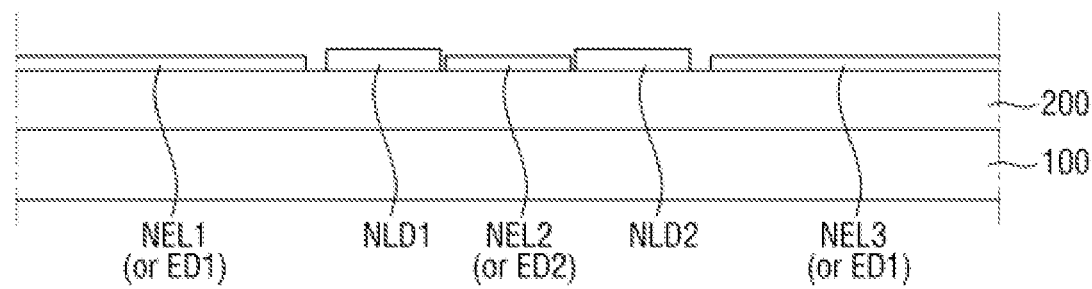

Referring to FIG. 20B, a fine light emitting diode NLD is disposed between the first and second diode electrodes ED1 and ED2, and a voltage is applied to each of the first diode electrode ED1 and the second diode electrode ED2 to arrange the fine light emitting diode NLD (for example, first and second fine light emitting diodes NDL1 and NDL2) in a particular direction. As described above, the fine light emitting diode NLD may be injected on the buffer layer 200 in the state of being mixed with a special solution, and because the special solution is naturally dried or removed, the fine light emitting diode NLD may be disposed on (or at) the buffer layer 200.

Figure 20C:
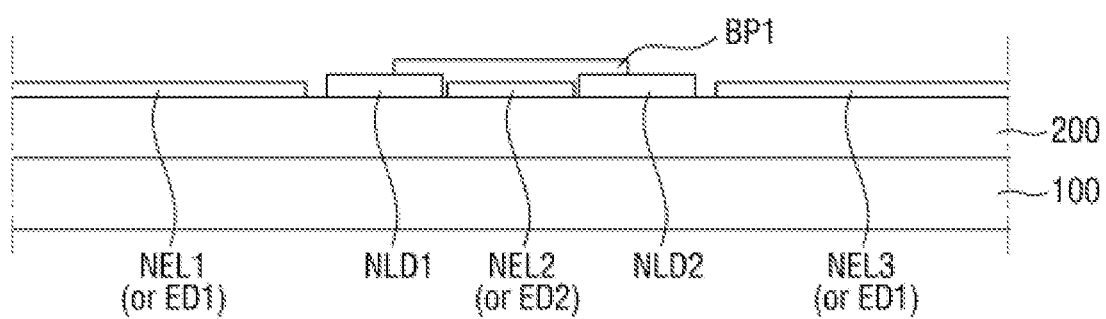

Referring to FIG. 20C, a second conductive layer (alternatively, a first bridge pattern BP1) is formed on the second diode electrode ED2 and the fine light emitting diode NLD. The second conductive layer may be formed through one mask process (for example, a second mask process).

The second conductive layer (alternatively, the first bridge pattern BP1) may partially cover the fine light emitting diode NLD (for example, the first and second fine light emitting diodes NLD1 and NLD2) to directly fix the first and second fine light emitting diodes NLD1 and NLD2 to the buffer layer 200. Accordingly, a process of forming a separate insulation layer for fixing the first and second fine light emitting diodes NLD1 and NLD2 may not be included before the process of forming the second conductive layer.

Figure 20D:
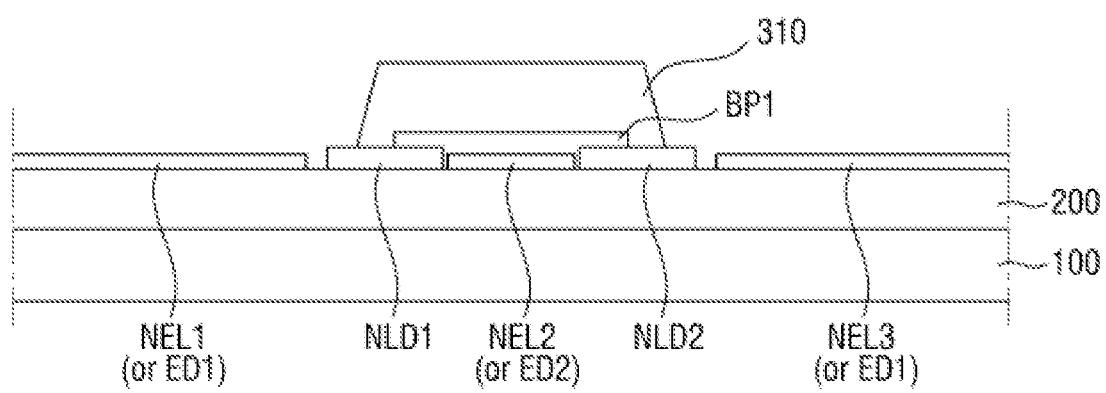

Further, referring to FIG. 20D, a first insulation layer (alternatively, a first passivation layer 310) is formed on (or at) the fine light emitting diode NLD and the second conductive layer (alternatively, the first bridge pattern BP1). The second passivation layer 320 may be formed through one mask process (for example, a third mask process).

Figure 20E:
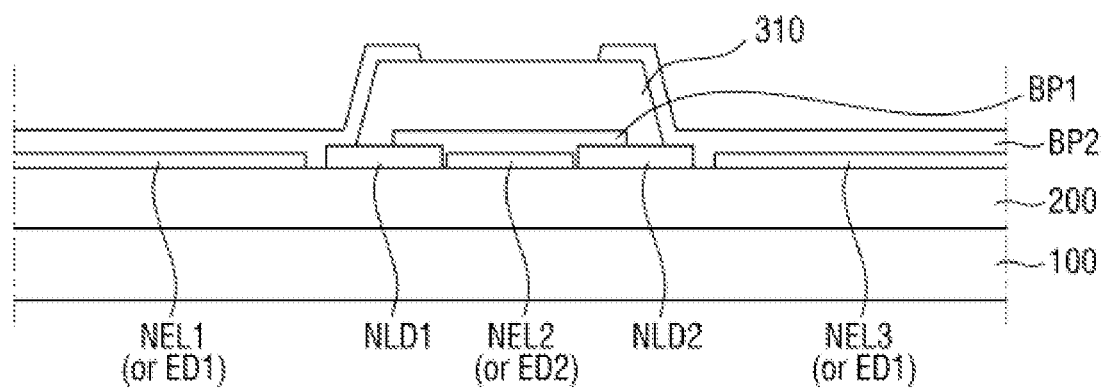

Further, referring to FIG. 20E, a third conductive layer (alternatively, a second bridge pattern BP2) is formed on the first conductive layer (alternatively, the first diode electrode ED1), the fine light emitting diode NLD, and the first insulation layer (alternatively, the first passivation layer 310). The second bridge pattern BP2 may be formed through one mask process (for example, a fourth mask process).

As described above, the light emitting unit LU may be manufactured using four mask processes such as forming the electrode, forming the first conductive layer, forming the first insulation layer, and forming the second conductive layer. Because the light emitting unit LU according to embodiments of the present invention has the bottom emission structure, the mask process of forming a separate partition before forming the electrode may not be included, and a mask process of fixing the electrode between the forming of the electrode and the forming of the first conductive layer may not be included. As such, the light emitting unit LU may be manufactured through a mask process of which subprocesses are relatively reduced (e.g., a simplified process).

According to embodiments of the present disclosure, a light emitting device in which reliability of a connection structure between a light emitting unit and an electrode connected to the light emitting body is secured can be provided.

Further, a method of manufacturing the light emitting device in which reliability of the connection structure between the light emitting units and the electrode connected to the light emitting unit can be secured can be provided.

What is claimed is:

1. A light emitting device comprising:
a base layer;
a first conductive layer disposed on the base layer, the first conductive layer comprising a first electrode pattern and a second electrode pattern, and exposing a portion of the base layer at a first area between the first electrode pattern and the second electrode pattern;
a light emitting diode at the first area on the base layer;
a second conductive layer covering the second electrode pattern and a first side of the light emitting diode, the second conductive layer being in contact with the second electrode pattern and directly in contact with the first side of the light emitting diode;
a first insulation layer disposed on at least a portion of an upper surface of the second conductive layer and the light emitting diode, the first insulation layer partially exposing a second side of the light emitting diode opposite to the first side of the light emitting diode; and
a third conductive layer covering the first electrode pattern and the second side of the light emitting diode, the third conductive layer contacting the first electrode pattern and directly in contact with the second side of the light emitting diode, and disposed on at least a portion of a sidewall of the first insulation layer, the second conductive layer being located between the base layer and the third conductive layer in a direction perpendicular to the first area on the base layer,
wherein at least a portion of the first insulation layer is directly disposed on the light emitting diode and disposed between the second conductive layer and the third conductive layer in the direction perpendicular to the first area on the base layer.

2. The light emitting device of claim 1, further comprising:
a second insulation layer on the third conductive layer, and overlapping the base layer;
a driving circuit layer on the second insulation layer, and comprising a thin film transistor; and
a data conductor electrically connecting the thin film transistor and the second electrode pattern through an opening in the second insulation layer, the opening exposing the second conductive layer.

3. The light emitting device of claim 2, further comprising a third insulation layer on the driving circuit layer,
wherein the second conductive layer covers the light emitting diode,
wherein the opening passes through the third conductive layer to expose the second conductive layer, and
wherein the data conductor is insulated from the third conductive layer through the third insulation layer at an inner side surface of the opening.

4. The light emitting device of claim 1, further comprising:
a buffer layer between the base layer and the first conductive layer; and
a reflection layer between the base layer and the buffer layer, and overlapping the light emitting diode.

5. The light emitting device of claim 4, wherein the reflection layer overlaps the first and second electrode patterns.

6. The light emitting device of claim 4, wherein the reflection layer overlaps the second electrode pattern, and partially overlaps the first electrode pattern.

7. The light emitting device of claim 4, further comprising:
a driving circuit layer under the base layer, and comprising a thin film transistor; and
a data conductor connecting the driving circuit layer and the second electrode pattern through an opening in the base layer and the buffer layer, the opening exposing the second electrode pattern.

8. The light emitting device of claim 1, further comprising a partition on the base layer and under the first electrode pattern,
wherein the second electrode pattern is in direct surface contact with the base layer.

9. The light emitting device of claim 1, wherein the light emitting diode comprises a light emitting material and a protection layer around the light emitting material in a cylindrical shape.

10. The light emitting device of claim 9, wherein the light emitting diode has a cylindrical shape, and comprises a first sidewall corresponding to an upper surface thereof and a second sidewall corresponding to a lower surface thereof.

11. The light emitting device of claim 10, wherein the light emitting material has a structure in which a p-type semiconductor layer, an intermediate layer, and an n-type semiconductor layer are sequentially arranged.

12. The light emitting device of claim 11, wherein the first sidewall exposes the p-type semiconductor layer, and the second sidewall exposes the n-type semiconductor layer.

13. The light emitting device of claim 12, wherein the first sidewall is in contact with the second conductive layer, and the second sidewall is in contact with the third conductive layer.

14. The light emitting device of claim 10, wherein the light emitting material has an inorganic crystalline structure.

15. The light emitting device of claim 1, wherein the first insulation layer covers the second conductive layer, and
wherein the third conductive layer covers the first insulation layer and comprises a reflective material.

16. The light emitting device of claim 1, further comprising a partition on the base layer and under the first and second electrode patterns.

17. The light emitting device of claim 16, further comprising:
a buffer layer between the base layer and the first conductive layer; and
a reflection layer between the base layer and the buffer layer, the reflection layer overlapping the light emitting diode.

18. A light emitting device comprising:
a base layer;
a first electrode pattern disposed on the base layer, and comprising first and second electrode lines that are parallel to each other;
a second electrode pattern disposed on the base layer, and comprising a third electrode line between the first and second electrode lines;
a first light emitting diode disposed between the first and third electrode lines;
a second light emitting diode disposed between the second and third electrode lines;
a first conductive layer directly disposed on the third electrode line, the first light emitting diode, and the second light emitting diode, the first conductive layer electrically connecting the second electrode pattern and directly in contact with the first and second light emitting diodes;
a first insulation layer disposed on at least a portion of an upper surface of the first conductive layer, and exposing a first side of each of the first and second light emitting diodes;
a second conductive layer disposed on the first electrode pattern and the first and second light emitting diodes, the second conductive layer electrically connecting the first electrode pattern and directly in contact with the first and second light emitting diodes, and disposed on at least a portion of a sidewall of the first insulation layer;
a second insulation layer on the second conductive layer and overlapping the base layer;
a driving circuit layer on the second insulation layer and comprising a thin film transistor; and
a data conductor electrically connecting the thin film transistor and the second electrode pattern through an opening in the second insulation layer, the opening exposing the first conductive layer, wherein at least a portion of the first insulation layer is directly disposed on the first light emitting diode and the second light emitting diode.

19. The light emitting device of claim 18, wherein the second conductive layer comprises:
   a first sub-conductive layer electrically connecting the first light emitting diode and the first electrode pattern; and
   a second sub-conductive layer electrically connecting the second light emitting diode and the first electrode pattern,
   wherein the second conductive layer does not overlap the second electrode pattern.

20. The light emitting device of claim 18, further comprising a third insulation layer on the driving circuit layer,
   wherein the second conductive layer covers the first and second light emitting diodes,
   wherein the opening passes through the second conductive layer to expose the first conductive layer, and
   wherein the data conductor is insulated from the second conductive layer through the third insulation layer at an inner side surface of the opening.

21. The light emitting device of claim 18, further comprising:
   a buffer layer between the base layer and the first and second electrode patterns; and
   a reflection layer between the base layer and the buffer layer, and overlapping the first and second light emitting diodes.

22. The light emitting device of claim 21, wherein the reflection layer overlaps the first and second electrode patterns.

23. The light emitting device of claim 21, wherein the reflection layer overlaps the third electrode line, and partially overlaps at least one of the first and second electrode lines.

24. The light emitting device of claim 21, further comprising:
   a second driving circuit layer under the base layer, and comprising a second thin film transistor; and
   a second data conductor connecting the second driving circuit layer and the second electrode pattern through an opening in the base layer and the buffer layer, the opening exposing the second electrode pattern.

25. The light emitting device of claim 18, further comprising a partition on the base layer and under the first electrode pattern.

* * * * *